(12) United States Patent
Yi et al.

(10) Patent No.: US 11,997,895 B2
(45) Date of Patent: May 28, 2024

(54) DISPLAY DEVICE INCLUDING FIRST AND SECOND LOWER PATTERNS AND METHOD OF MANUFACTURING THE SAME

(71) Applicant: Samsung Display Co., Ltd., Yongin-Si (KR)

(72) Inventors: Changho Yi, Seoul (KR); Sungho Kim, Suwon-si (KR); Seokje Seong, Seongnam-si (KR); Yoon-Jong Cho, Seongnam-si (KR); Hyeri Cho, Asan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 309 days.

(21) Appl. No.: 17/381,579

(22) Filed: Jul. 21, 2021

(65) Prior Publication Data

US 2022/0199741 A1    Jun. 23, 2022

(30) Foreign Application Priority Data

Dec. 18, 2020   (KR) .................. 10-2020-0179029

(51) Int. Cl.
| | |
|---|---|
| *H10K 59/131* | (2023.01) |
| *G02F 1/1343* | (2006.01) |
| *G02F 1/1345* | (2006.01) |
| *G02F 1/135* | (2006.01) |
| *H10K 59/12* | (2023.01) |
| *H10K 59/121* | (2023.01) |

(52) U.S. Cl.
CPC ......... *H10K 59/131* (2023.02); *G02F 1/1343* (2013.01); *G02F 1/134309* (2013.01); *G02F 1/1345* (2013.01); *G02F 1/13452* (2013.01); *G02F 1/13458* (2013.01); *G02F 1/1357* (2021.01); *H10K 59/1213* (2023.02); *H10K 59/1201* (2023.02)

(58) Field of Classification Search
CPC .................. H10K 59/1213; H10K 59/126
See application file for complete search history.

(56) References Cited

U.S. PATENT DOCUMENTS

| | | | |
|---|---|---|---|
| 7,892,974 B2 | 2/2011 | Ring et al. | |
| 2009/0236604 A1* | 9/2009 | Bae ..................... | G02F 1/13458 257/E33.001 |
| 2019/0081090 A1* | 3/2019 | Lee ..................... | H10K 59/126 |

FOREIGN PATENT DOCUMENTS

| | | |
|---|---|---|
| KR | 1020180072440 A | 6/2018 |
| KR | 1020200051901 A | 5/2020 |
| KR | 1020200113055 A | 10/2020 |

\* cited by examiner

*Primary Examiner* — Lauren Nguyen
(74) *Attorney, Agent, or Firm* — CANTOR COLBURN LLP

(57) ABSTRACT

A display device includes a substrate, a first lower pattern disposed on the substrate, a second lower pattern disposed in a same layer as the first lower pattern and integrally formed with the first lower pattern, an etch stopper disposed on the second lower pattern, a power voltage line disposed on the first lower pattern, and a transfer pattern disposed on the etch stopper, connected to the power voltage line, and contacting the second lower pattern through a contact hole defined through the etch stopper.

10 Claims, 29 Drawing Sheets

DISPLAY DEVICE INCLUDING FIRST AND SECOND LOWER PATTERNS AND METHOD OF MANUFACTURING THE SAME

This application claims priority to Korean Patent Application No. 10-2020-0179029, filed on Dec. 18, 2020, and all the benefits accruing therefrom under 35 U.S.C. § 119, the content of which in its entirety is herein incorporated by reference.

BACKGROUND

1. Field

The disclosure generally relates to a display device. More specifically, the disclosure generally relates to a display device including a lower pattern.

2. Description of the Related Art

A display device typically includes a display panel, and transistors including an active pattern are disposed on the display panel. An electric field may be generated inside the display panel by signals and voltages provided to the display panel. In addition, the display panel typically includes a layer including an organic material.

SUMMARY

In a display device, organic materials included in a layer of a display panel may be polarized by an electric field generated inside the display panel. The polarized organic materials may have an electrical effect on an active pattern of transistors included in the display panel. Accordingly, in such a display device, electrical characteristics of the transistors may be changed. Therefore, the display quality of the display device may be deteriorated.

Some embodiments provide a display device.

Some embodiments provide a method of manufacturing the display device.

An embodiment of a display device according to the disclosure includes a substrate including a display area and a non-display area surrounding the display area, a first lower pattern disposed on the substrate and overlapping the display area, a second lower pattern disposed in a same layer as the first lower pattern, overlapping the non-display area, and integrally formed with the first lower pattern, an etch stopper disposed on the second lower pattern, a power voltage line disposed on the first lower pattern, and a transfer pattern disposed on the etch stopper, connected to the power voltage line, and contacting the second lower pattern through a contact hole defined through the etch stopper.

According to an embodiment, the display device may further include a first active pattern disposed on the first lower pattern and overlapping the first lower pattern, and the etch stopper may be disposed in a same layer as the first active pattern.

According to an embodiment, the etch stopper may include a silicon semiconductor.

According to an embodiment, the etch stopper may include an oxide semiconductor.

According to an embodiment, the transfer pattern may include a first pattern contacting the second lower pattern and a second pattern disposed on the first pattern, contacting the first pattern, and integrally formed with the power voltage line.

According to an embodiment, the first lower pattern may include an overlap pattern overlapping a gate electrode, first bridges connected to the overlap pattern and extending along a first direction, and second bridges connected to the overlap pattern, extending along a second direction crossing the first direction, and overlapping the power voltage line. The second lower pattern may extend along the first direction and may be connected to the second bridges.

According to an embodiment, the display device may further include a first active pattern disposed on the first lower pattern and overlapping the first lower pattern and a gate electrode disposed on the first active pattern and overlapping the first lower pattern. The etch stopper may be disposed in a same layer as the gate electrode.

According to an embodiment, the display device may further include a first barrier layer disposed between the substrate and the second lower pattern and a second barrier layer disposed on the second lower pattern.

According to an embodiment, the substrate may further include a bending area included in the non-display area, an etching hole may be defined through an insulating layer overlapping the bending area, and a depth of the etching hole may be greater than a depth of the contact hole.

According to an embodiment, the contact hole may include a first contact hole and a second contact hole connected to the first contact hole, and a plane area of the second contact hole may be smaller than a plane area of the first contact hole.

An embodiment of a method of manufacturing a display device according to the disclosure includes providing a first lower pattern and a second lower pattern integrally with each other on a substrate, providing a first insulating layer disposed on the first lower pattern and the second lower pattern, providing an etch stopper on the first insulating layer, where the etch stopper overlaps the second lower pattern, providing a second insulating layer on the first insulating layer, where the second insulating layer covers the etch stopper, providing a power voltage line on the second insulating layer, where the power voltage line overlaps the first lower pattern, forming a first contact hole through the second insulating layer to expose the etch stopper, forming a second contact hole through the etch stopper and the first insulating layer to expose the second lower pattern, where the second contact hole is connected to the first contact hole, and providing a transfer pattern on the etch stopper, where the transfer pattern is connected to the power voltage line and contacts the second lower pattern through the first contact hole and the second contact hole.

According to an embodiment, the substrate may include a bending area in which an etching hole is formed through the first insulating layer and the second insulating layer, and the etching hole may be formed together with the first contact hole and the second contact hole during a same process.

According to an embodiment, the etching hole may include a first etching hole exposing the first insulating layer and a second etching hole connected to the first etching hole, and a depth of the second etching hole may be greater than a depth of the second contact hole.

According to an embodiment, the method may further include providing an active pattern on the first insulating layer, where the active pattern may overlap the first lower pattern, and the etch stopper may be integrally formed with the active pattern.

According to an embodiment, the etch stopper may include a silicon semiconductor.

According to an embodiment, the etch stopper may include an oxide semiconductor.

According to an embodiment, the method may further include forming a third contact hole through the second insulating layer to expose the active pattern, and the third contact hole may be formed together with the first contact hole during a same process.

According to an embodiment, the transfer pattern may include a first pattern contacting the second lower pattern through the first contact hole and the second contact hole; and a second pattern disposed on the first pattern, contacting the first pattern, and integrally formed with the power voltage line.

According to an embodiment, a plane area of the second contact hole may be smaller than a plane area of the first contact hole.

Embodiments of a display device according to the disclosure may include a first lower pattern disposed between a substrate and an active pattern, a second lower pattern integrally formed with the first lower pattern, and a transfer pattern connected to the second lower pattern.

In such embodiments, the first lower pattern may overlap the gate electrodes. Accordingly, the first lower pattern may shield the active pattern from polarization of organic materials included in the substrate. Accordingly, the electrical characteristics of the transistor may not be changed.

In such embodiments, the display device may include a transfer pattern connected to a power voltage line. As the transfer pattern retransmits the power voltage from the upper side of the display panel, a voltage drop of the power voltage provided to the display panel may be effectively prevented.

In such embodiments, as the transfer pattern is electrically connected to the first lower pattern through the second lower pattern, a voltage drop of the power voltage provided to the first lower pattern may be effectively prevented.

In such embodiments, the transfer pattern may contact the second lower pattern through first and second contact holes. The second contact hole may be connected to the first contact hole, and may expose the second lower pattern. The first and second contact holes may be formed together with contact holes (or etching holes) formed in a display area (or a bending area). Accordingly, the first and second contact holes may be formed without any additional process.

In such embodiments, an etch stopper may be additionally disposed on the second lower pattern. The second contact hole is defined through the etch stopper. As an etch selectivity exists between the etch stopper and the insulating layers, the second lower pattern may not be lost while the second contact hole is formed. Accordingly, the thicknesses of the first and second lower patterns may be set to be relatively small. Accordingly, the productivity of the first and second lower patterns may be increased.

In such embodiments, as the thickness of the first lower pattern is set to be small, the difficulty of the crystallization process for crystallizing the active pattern, the difficulty of the inspection process performed before performing the crystallization process, and/or the difficulty of the inspection process after the crystallization process is performed may be lowered.

BRIEF DESCRIPTION OF THE DRAWINGS

The accompanying drawings, which are included to provide a further understanding of the disclosure and are incorporated in and constitute a part of this specification, illustrate some embodiments of the disclosure, and together with the description serve to explain the inventive concepts.

DETAILED DESCRIPTION

Figure 1:
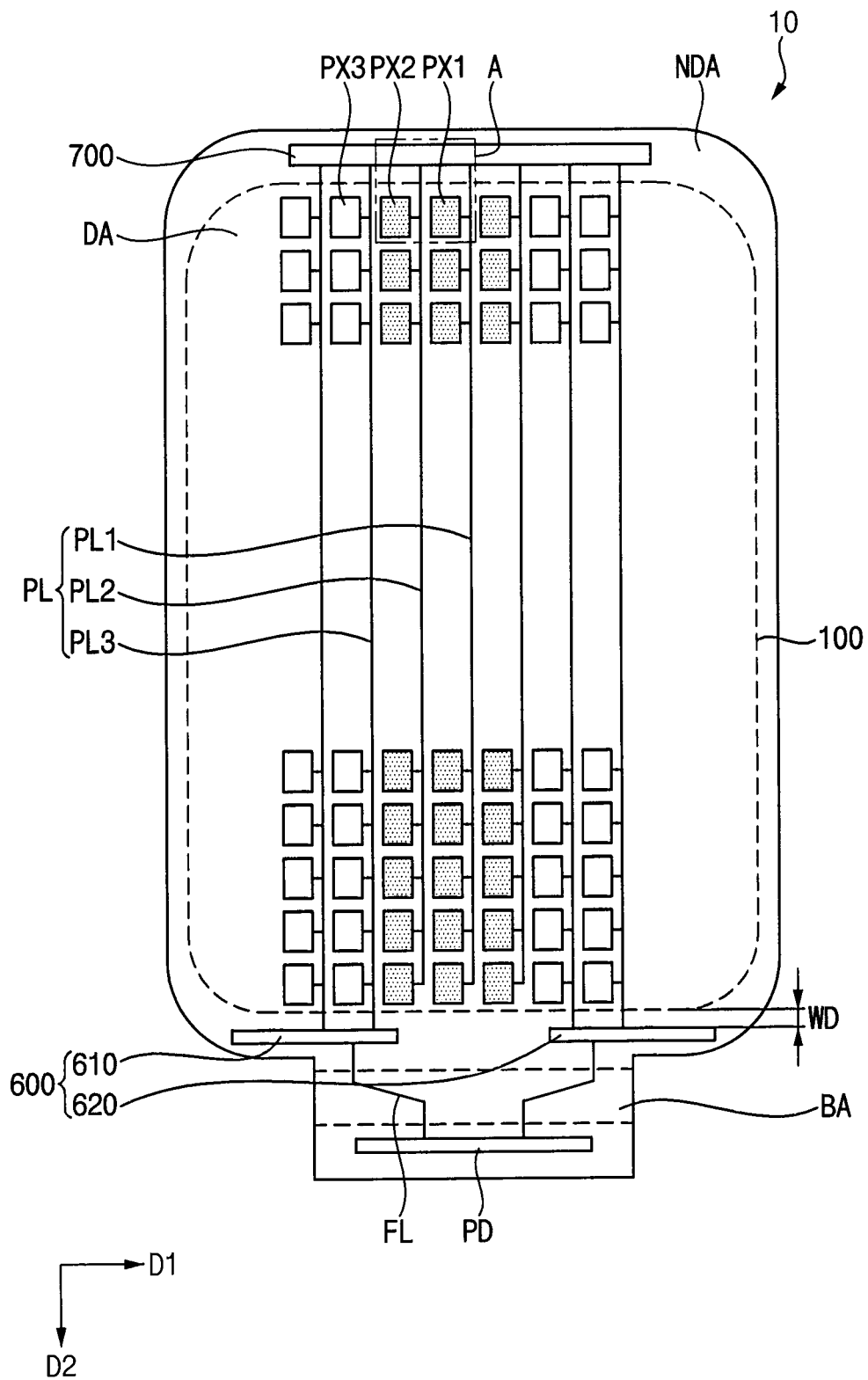
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the specification and the claims, the phrase "at least one of" is intended to include the meaning of "at least one selected from" for the purpose of its meaning and interpretation. For example, "at least one of A and B" may be understood to mean "A, B, or A and B."

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
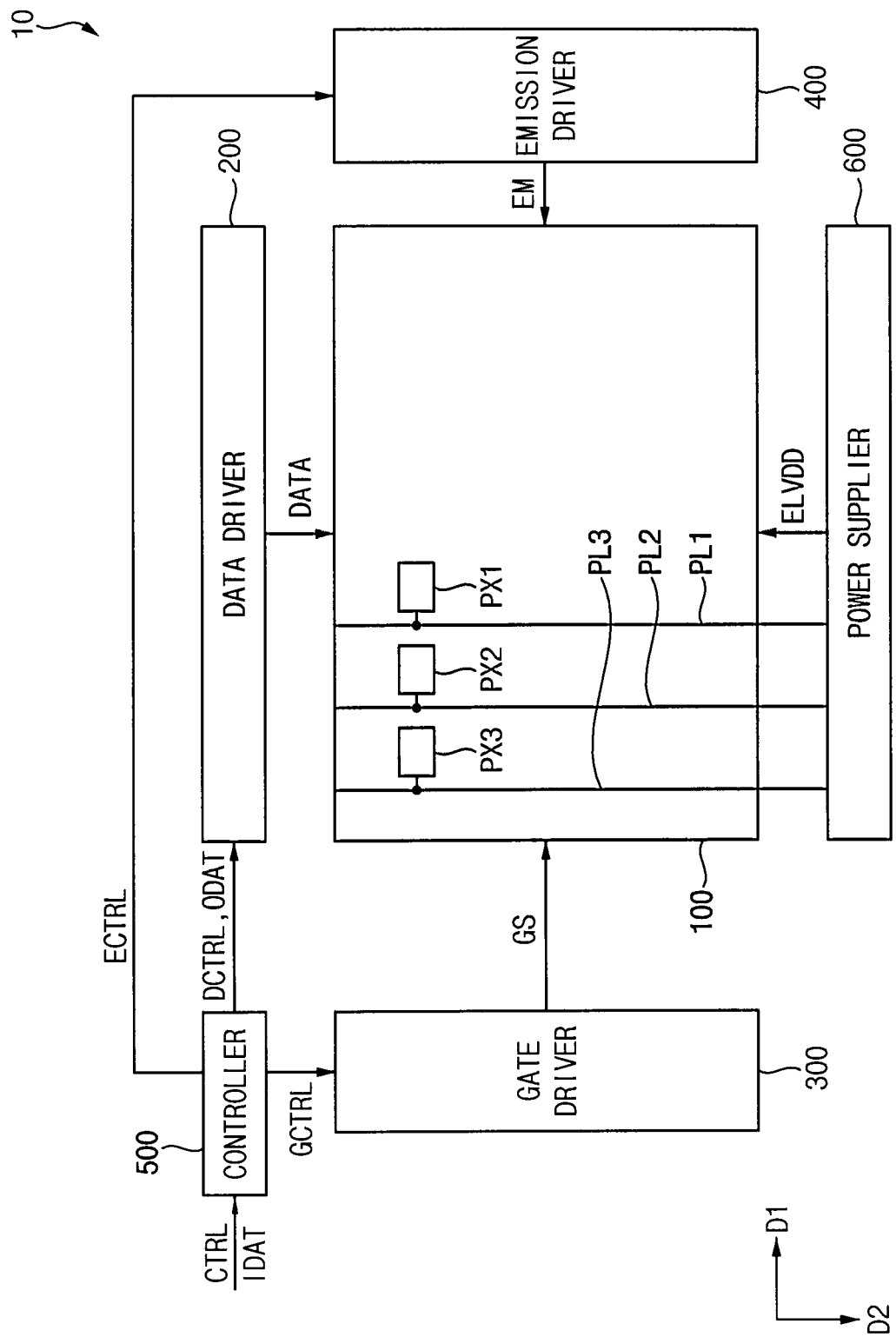
FIG. 2 is a block diagram illustrating the display device of FIG. 1.
Figure 3:
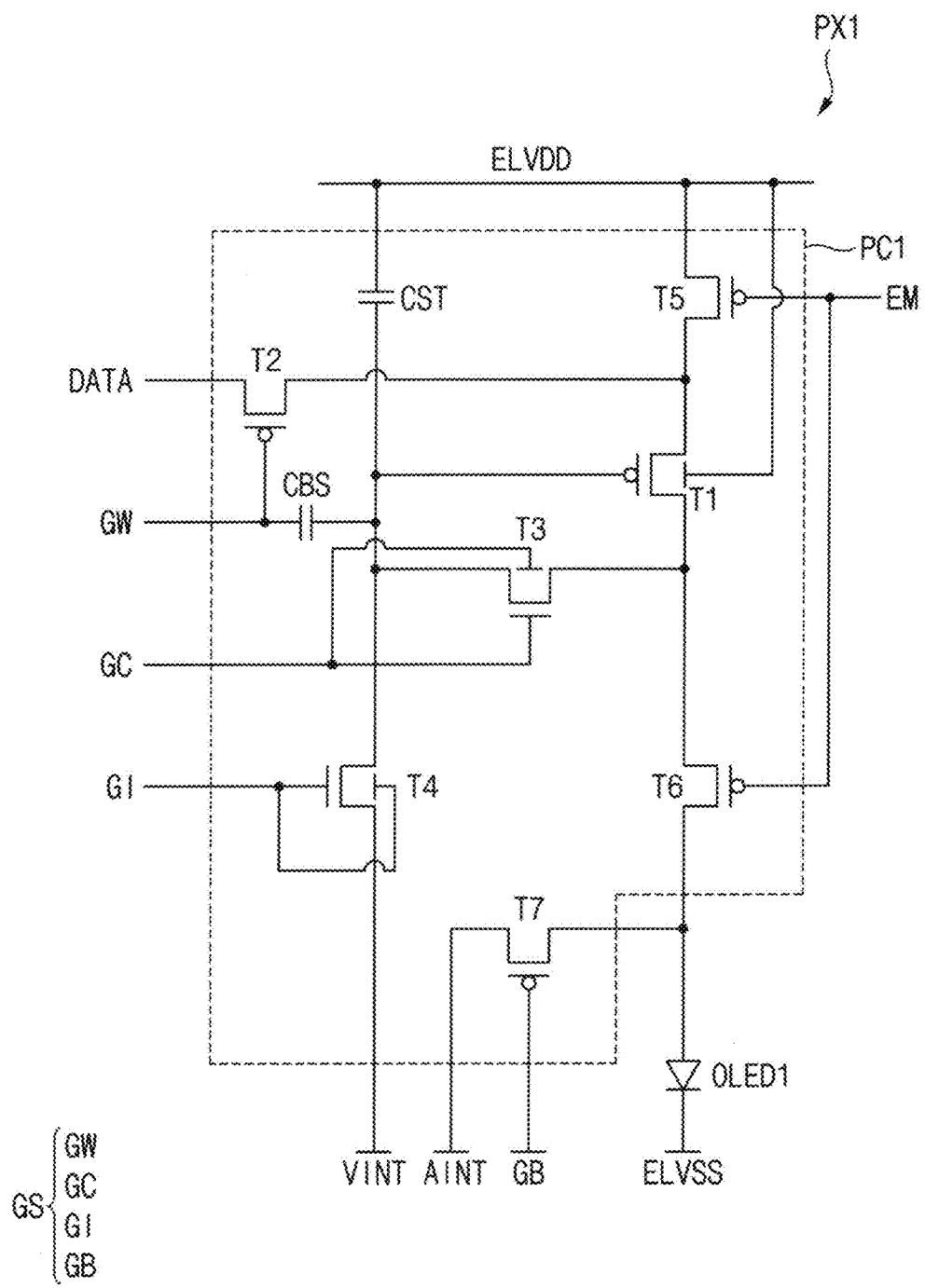
FIG. 3 is a circuit diagram illustrating a first pixel included in the display device of FIG. 2.

FIG. 1 is a plan view illustrating a display device according to an example embodiment. FIG. 2 is a block diagram illustrating the display device of FIG. 1. FIG. 3 is a circuit diagram illustrating a first pixel included in the display device of FIG. 2.

Referring to FIGS. 1 and 2, an embodiment of a display device 10 according to the invention may be divided into a display area DA and a non-display area NDA. The non-display area NDA may include a bending area BA. In one embodiment, for example, the display area DA may have a rectangular shape having a short side extending along a first direction D1 and a long side extending along a second direction D2 crossing the first direction D1. The non-display area NDA may surround the display area DA. A fan-out line FL may be disposed in the bending area BA, and the bending area BA may be bent.

A display panel 100 may be disposed in the display area DA. A data driver 200, a gate driver 300, an emission driver 400, a timing controller 500, a power supply 600, and a transfer pattern 700 may be disposed in the non-display area NDA.

A first pixel PX1, a second pixel PX2, and a third pixel PX3 may be disposed in the display panel 100. Each of the first to third pixels PX1, PX2, and PX3 may be electrically connected to a corresponding data line, a corresponding gate line, a corresponding emission control line, and a corresponding power supply line PL.

The power supply line PL may include first to third power supply lines PL1, PL2, and PL3. The first power supply line PL1 may extend along the second direction D2 and may be connected to the first pixel PX1. The second power supply line PL2 may extend along the second direction D2 and may be connected to the second pixel PX2. The third power supply line PL3 may extend along the second direction D2 and may be connected to the third pixel PX3. In an embodiment, the first power supply line PL1 and the second power supply line PL2 may be formed in or defined by one pattern (e.g., the power voltage line 1720 in FIG. 6). The third power supply line PL3 may be formed in or defined by another pattern spaced apart from the one pattern.

The data line may be connected to the data driver DDV and may extend along the second direction D2. The data line may transfer a data voltage DATA.

The gate line may be connected to the gate driver 300 and may extend along the first direction D1. The gate line may transfer a gate signal GS.

The emission control line may be connected to the emission driver 400 and may extend along the first direction D1. The emission control line may transfer an emission control signal EM. In one embodiment, for example, an activation period of the emission control signal EM may be an emission period of the display device 10, and an inactivation period of the emission control signal EM may be a non-emission period of the display device 10.

The gate driver 300 may receive a gate control signal GCTRL from the timing controller 500 and generate the gate signal GS. In one embodiment, for example, the gate signal GS may include a first gate signal GW, a second gate signal GC, a third gate signal GI, and a fourth gate signal GB.

The data driver 200 may receive output image data ODAT and a data control signal DCTRL from the timing controller 500 and may generate the data voltage DATA. The emission driver 400 may receive an emission driving control signal ECTRL from the timing controller 500 and may generate the emission control signal EM. The timing controller 500 may receive a control signal CTRL and input image data DAT from an external device, may control the data driver 200, the gate driver 300, and the emission driver 400.

In one embodiment, for example, the data driver 200 and the timing controller 500 may be disposed on a flexible printed circuit board, the gate driver 300 may be mounted in the non-display area NDA adjacent to the left side of the display area DA, and the emission driver 400 may be mounted in the non-display area NDA adjacent to the right side of the display area DA. However, positions where the data driver 200, the gate driver 300, the emission driver 400, and the timing controller 500 are disposed are not limited thereto.

The power supply 600 may be connected to the power supply line PL and may provide a power voltage ELVDD to the power supply line PL. In one embodiment, for example, the power supply 600 may receive the power voltage ELVDD from a pad part PD through the fan-out line FL, and may transfer the power voltage ELVDD to the pixels through the power supply line PL. The pad part PD may be disposed in the non-display area NDA, and the power supply 600 may be disposed between the display panel 100 and the pad part PD.

In an embodiment, the power supply 600 may include a first power supply 610 and a second power supply 620. In one embodiment, for example, the first power supply 610 may be adjacent to a left side of the display panel 100, and the second power supply 620 may be adjacent to a right side of the display panel 100. The first power supply 610 may be connected to a power supply line (e.g., the third power supply line PL3) positioned on the left side of the display panel 100. Accordingly, the first power supply 610 may provide the power voltage ELVDD to pixels (e.g., the third pixel PX3) positioned on the left side of the display panel 100. In such an embodiment, the second power supply 620 may be connected to a power supply line positioned on the right side of the display panel 100. Accordingly, the second power supply 620 may provide the power voltage ELVDD to pixels positioned on the right side of the display panel 100.

In an embodiment, the first power supply 610 may be integrally formed with the third power supply line PL3 as a single unitary unit. In addition, the first power supply 610 may not be directly connected to the first and second power supply lines PL1 and PL2. The first and second power supply lines PL1 and PL2 may receive the power voltage ELVDD from the transfer pattern 700. Accordingly, the display device 10 may not include separate fan-out lines for connecting the first power supply 610 and the first power supply line PL1 (or the second power supply line PL2) to each other. Accordingly, in such an embodiment, a width of the non-display area NDA (e.g., a distance WD from the power supply 600 to the display panel 100) may be reduced.

In an embodiment, the transfer pattern 700 may be disposed in the non-display area NDA, and may be adjacent to an upper side of the display panel 100. The transfer pattern 700 may be connected to the power supply line PL. Accordingly, the transfer pattern 700 may receive the power voltage ELVDD from a power supply line (e.g., the third power supply line PL3) positioned on the left side of the display panel 100. In such an embodiment, the transfer pattern 700 may transfer the power voltage ELVDD to a power supply line (e.g., the first and second power supply lines PL1 and PL2) positioned at the center of the display panel. As the transfer pattern 700 retransmits the power voltage ELVDD in the upper side of the display panel 100, a voltage drop (IR-Drop) of the power voltage ELVDD provided to the display panel 100 may be effectively prevented. In an alternative embodiment, the transfer pattern 700 may be disposed in the display area DA.

Referring to FIG. 3, the first pixel PX1 may include a pixel circuit PC1 and a first organic light emitting diode OLED1. The first pixel circuit PC1 may provide a driving current to the first organic light emitting diode OLED1, and the first organic light emitting diode OLED1 may generate light based on the driving current. Each of the second and third pixels PX2 and PX3 may have substantially a same circuit structure as that of the first pixel PX1.

The first pixel circuit PC1 may include a first transistor T1, a second transistor T2, a third transistor T3, a fourth transistor T4, a fifth transistor T5, a sixth transistor T6, a seventh transistor T7, a storage capacitor CST, and a boosting capacitor CBS.

The first organic light emitting diode OLED1 may include a first terminal (e.g., an anode terminal) and a second terminal (e.g., a cathode terminal), the first terminal of the first organic light emitting diode OLED1 may be connected to the sixth transistor T6 and the seventh transistor T7, and the second terminal of the first organic light emitting diode OLED1 may receive a common voltage ELVSS. The first organic light emitting diode OLED1 may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the power voltage ELVDD. The storage capacitor CST may maintain a voltage level of a gate terminal of the first transistor T1 during an inactive period of the first gate signal GW.

The boosting capacitor CBS may include a first terminal and a second terminal. The first terminal of the boosting capacitor CBS may be connected to the third transistor T3, and the second terminal of the boosting capacitor CBS may receive the first gate signal GW. As the boosting capacitor CBS increases the voltage of the gate terminal of the first transistor T1 at a point in time when the provision of the first gate signal GW is stopped, the boosting capacitor CBS may compensate the voltage drop of the gate terminal.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 and may receive the data voltage DATA. The second terminal of the first transistor T1 may be connected to the sixth transistor T6. The first transistor T1 may generate the driving current based on a voltage difference between the gate terminal and the first terminal. In such an embodiment, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. In one embodiment, for example, where the second transistor T2 is a P-channel metal-oxide-semiconductor ("PMOS") transistor, the second transistor T2 may be turned off when the first gate signal GW has a positive voltage level, and may be turned on when the first gate signal GW has a negative voltage level. The first terminal of the second transistor T2 may receive the data voltage DATA through the data line DL. The second terminal of the second transistor T2 may provide the data voltage DATA to the first terminal of the first transistor T1 while the second transistor T2 is turned on. In such an embodiment, the second transistor T2 may be referred to as a switching transistor.

The third transistor T3 may include a gate terminal, a bottom gate terminal, a first terminal (e.g., a source terminal), and a second terminal (e.g., a drain terminal). The gate terminal and the bottom gate terminal of the third transistor T3 may receive the second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. In one embodiment, for example, where the third transistor T3 is an N-channel metal-oxide-semiconductor ("NMOS") transistor, the third transistor T3 may be turned on when the second gate signal GC has a positive voltage level, and may be turned off when the second gate signal GC has a negative voltage level.

During a period in which the third transistor T3 is turned on in response to the second gate signal GC, the third transistor T3 may diode-connect the first transistor T1. The third transistor T3 may compensate for the threshold voltage of the first transistor T1. In such an embodiment, the third transistor T3 may be referred to as a compensation transistor.

The fourth transistor T4 may include a gate terminal, a bottom gate terminal, a first terminal (e.g., a source terminal), and a second terminal (e.g., a drain terminal). The gate terminal and the bottom gate terminal of the fourth transistor T4 may receive the third gate signal GI. The first terminal of the fourth transistor T4 may be connected to the gate terminal of the first transistor T1. The second terminal of the fourth transistor T4 may receive the gate initialization voltage VINT.

The fourth transistor T4 may be turned on or off in response to the third gate signal GI. In one embodiment, for example, where the fourth transistor T4 is an NMOS transistor, the fourth transistor T4 may be turned on when the third gate signal GI has a positive voltage level, and may be turned off when the third gate signal GI has a negative voltage level.

During a period in which the fourth transistor T4 is turned on to the third gate signal GI, the gate initialization voltage VINT may be provided to the gate terminal of the first transistor T1. Accordingly, the fourth transistor T4 may initialize the gate terminal of the first transistor T1 to the gate initialization voltage VINT. In such an embodiment, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the power voltage ELVDD. The second terminal of the fifth transistor T5 may be connected to the first transistor T1. When the fifth transistor T5 is turned on in response to the emission control signal EM, the fifth transistor T5 may provide the power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the first transistor T1. The second terminal of the sixth transistor T6 may be connected to the first organic light emitting diode OLED1. When the sixth transistor T6 is turned on in response to the emission control signal EM, the sixth transistor T6 may provide the driving current to the first organic light emitting diode OLED1.

The seventh transistor T7 may include a gate terminal, a first terminal (e.g., a source terminal), and a second terminal (e.g., a drain terminal). The gate terminal of the seventh transistor T7 may receive the fourth gate signal GB. The first terminal of the seventh transistor T7 may be connected to the first organic light emitting diode OLED1. The second terminal of the seventh transistor T7 may receive an anode initialization voltage AINT.

When the seventh transistor T7 is turned on in response to the fourth gate signal GB, the seventh transistor T7 may provide the anode initialization voltage AINT to the first organic light emitting diode OLED1. Accordingly, the seventh transistor T7 may initialize the first terminal of the first organic light emitting diode OLED1 to the anode initialization voltage AINT. In such an embodiment, the seventh transistor T7 may be referred to as an anode initialization transistor.

In an embodiment, the first, second, fifth, sixth, and seventh transistors T1, T2, T5, T6, and T7 may be PMOS transistors, and the third and fourth transistors T3 and T4 may be NMOS transistors. Accordingly, the first active pattern of the PMOS transistors may include a silicon semiconductor doped with positive ions, and the second active pattern of the NMOS transistors may include an oxide semiconductor. In such an embodiment, the first gate signal GW, the emission control signal EM, and the fourth gate signal GB for turning on the second, fifth, sixth, and seventh transistors T2, T5, T6, and T7 may have a negative voltage level, and the second gate signal GC and the third gate signal GI for turning on the third and fourth transistors T3 and T4 may have a positive voltage level.

In embodiments, the circuit structure of the first pixel circuit PC1 is not limited that shown in FIG. 3, but may be variously changed or modified.

In an embodiment, as shown in FIG. 1, the first to third pixels PX1, PX2, and PX3 may be disposed along the first direction D1. The first pixel PX1 may be adjacent to the second pixel PX2. The third pixel PX3 may be spaced apart from the second pixel PX2.

Figure 4:
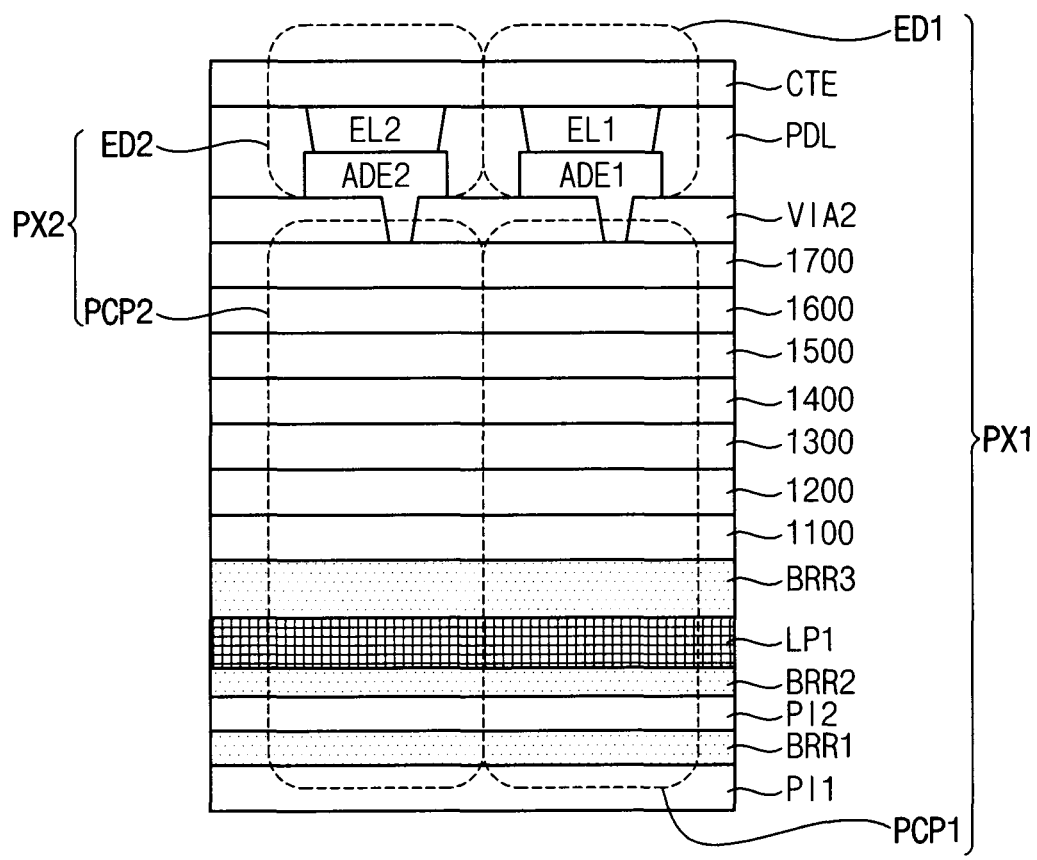
FIG. 4 is a cross-sectional view illustrating a display panel included in the display device of FIG. 1.
Figure 5:
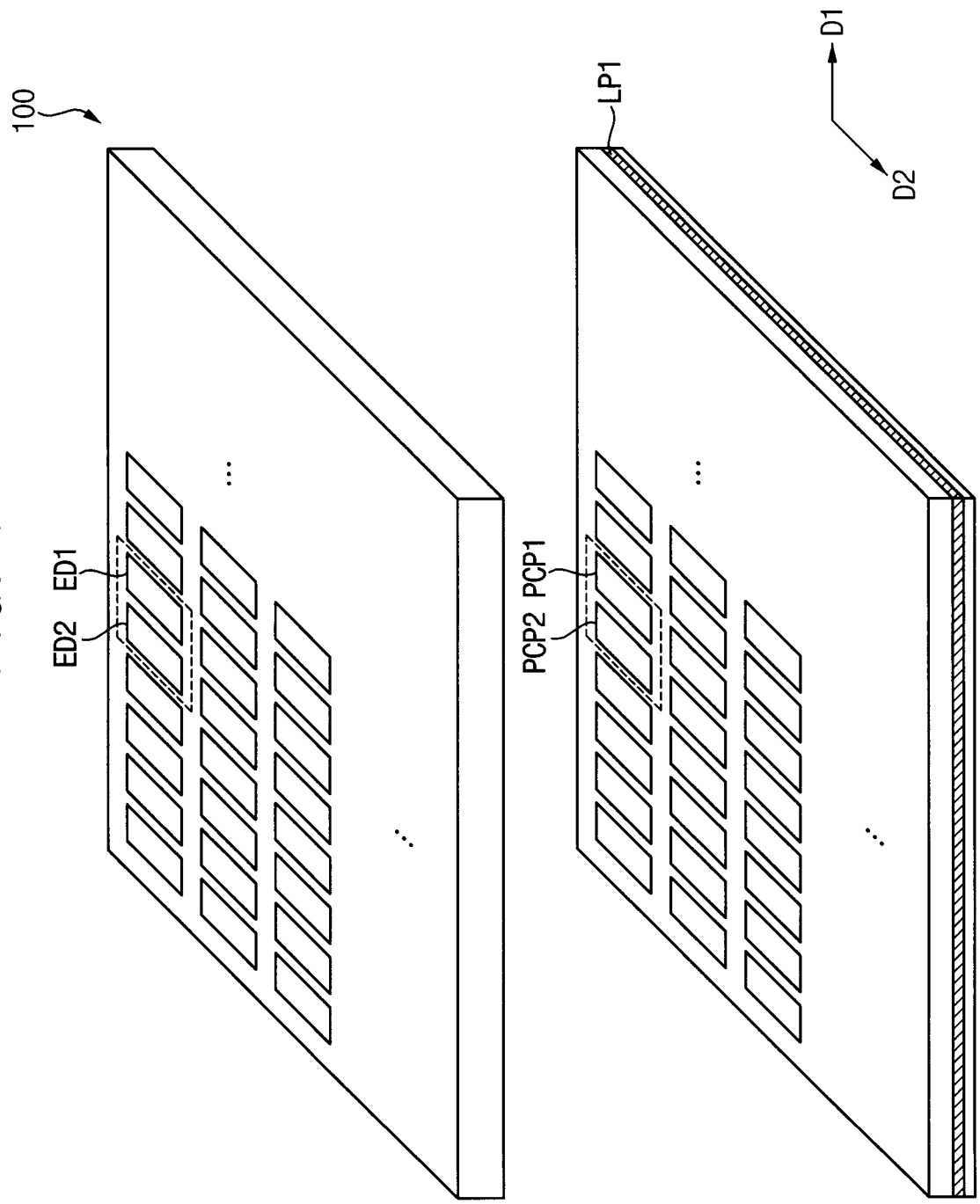
FIG. 5 is a perspective view illustrating a display panel included in the display device of FIG. 1.

FIG. 4 is a cross-sectional view illustrating a display panel included in the display device of FIG. 1. FIG. 5 is a perspective view illustrating a display panel included in the display device of FIG. 1.

Referring to FIGS. 1, 4, and 5, an embodiment of the display panel 100 may include first and second pixel circuit parts PCP1 and PCP2, and first and second emitting diodes ED1 and ED2.

In an embodiment, the first pixel circuit part PCP1 and the first emitting diode ED1 may constitute the first pixel PX1. In one embodiment, for example, the first pixel circuit part PCP1 may correspond to the first pixel circuit PC1, and the first emitting diode ED1 may correspond to the first organic light emitting diode OLED1. In such an embodiment, transistors (e.g., the first to seventh transistors T1, T2, T3, T4, T5, T6, and T7) may be formed or included in the first pixel circuit part PCP1, and the first pixel circuit part PCP1 may provide the driving current to the first emitting diode ED1. In such an embodiment, the second pixel circuit part PCP2 and the second emitting diode ED2 may constitute the second pixel PX2.

The first emitting diode ED1 may include a first pixel electrode ADE1 and a first emission layer EL1, which are disposed in an opening define through a pixel defining layer PDL, and a common electrode CTE disposed on the pixel defining layer PDL. In one embodiment, for example, the first emission layer EL1 may generate light having a first color. The second display device ED2 may include a second pixel electrode ADE2 and a second emission layer EL2, which are disposed in an opening define through the pixel defining layer PDL, and the common electrode CTE disposed on the pixel defining layer PDL. In one embodiment, for example, the second emission layer EL2 may generate light having a second color.

The first pixel circuit part PCP1 may include a first organic film layer PI1, a first barrier layer BRR1, a second organic film layer PI2, a second barrier layer BRR2, a first lower pattern LP1, a third barrier layer BRR3, a first active pattern 1100, a first conductive pattern 1200, a second conductive pattern 1300, a second active pattern 1400, a third conductive pattern 1500, a fourth conductive pattern 1600, and a fifth conductive pattern 1700. Insulation layers may be respectively disposed between the first lower pattern LP1 to the fifth conductive pattern 1700. In such an embodiment, a second via insulating layer VIA2 may be disposed on the fifth conductive pattern 1700, and the first and second pixel electrodes ADE1 and ADE2 may be connected to the fifth conductive pattern 1700 through contact holes defined through the second via insulating layer VIA2.

A conventional display device includes a display panel, and transistors including an active pattern are disposed in the display panel. An electric field may be generated inside the display panel by signals and voltages provided to the display panel. Organic materials included in a substrate of the display panel may be polarized by the electric field. The polarized organic materials may have an electrical effect on the active pattern(s) of the display panel. Accordingly, electrical characteristics of the transistors may be changed. In such a conventional display device, the polarization phenomenon may be further accelerated by light incident on the display panel. Therefore, the display quality of the conventional display device may be deteriorated.

In an embodiment of the invention, the display device 10 may include the first lower pattern LP1 disposed in the display panel 100. The first lower pattern LP1 may prevent the polarization phenomenon from affecting the first and second active patterns 1100 and 1400 electrically. Accordingly, electrical characteristics of the transistors may not be changed. Accordingly, the display quality of the display device 10 may be improved.

FIGS. 6 to 18 are plan views illustrating the display device of FIG. 1. FIG. 19 is a cross-sectional view taken along line I-I' of FIG. 18. Particularly, FIG. 6 is an enlarged view of an area A of FIG. 1.

Figure 6:
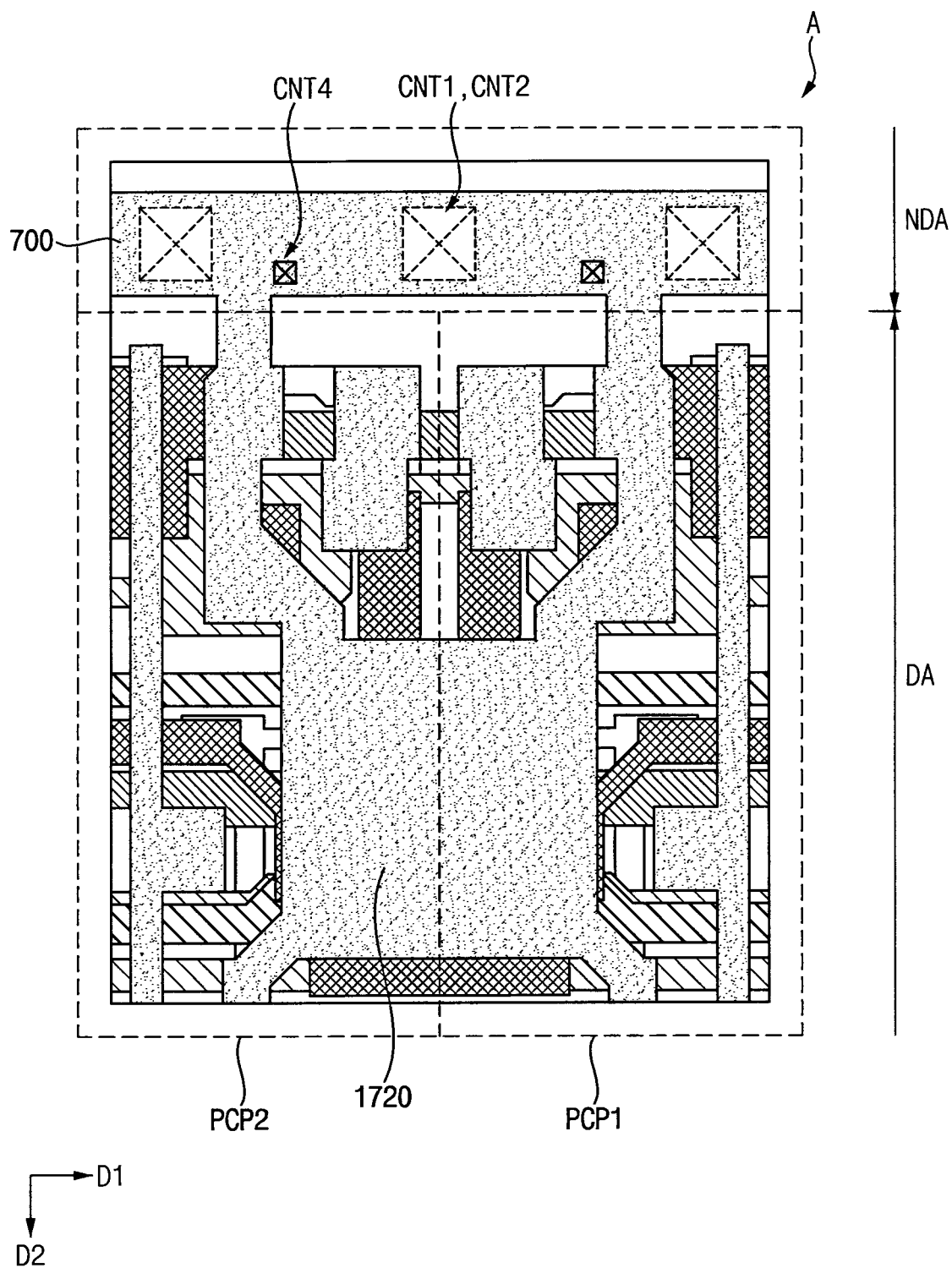
FIGS. 6 to 18 are plan views illustrating the display device of FIG. 1.

Referring to FIGS. 1 and 6, an embodiment of the display device 10 may include a plurality of pixel circuit parts arranged in a matrix shape and the transfer pattern 700. In one embodiment, for example, the first and second pixel circuit parts PCP1 and PCP2 may be arranged along the first direction D1, and the transfer pattern 700 may be connected to a power voltage line 1720 included in the first and second pixel circuit parts PCP1 and PCP2. In an embodiment, a shape of the second pixel circuit part PCP2 may be symmetrical with a shape of the first pixel circuit part PCP1 with respect to an axis in the second direction D2. Hereinafter, the first pixel circuit part PCP1, the second pixel circuit part PCP2, and the transfer pattern 700 will be described.

Figure 7:
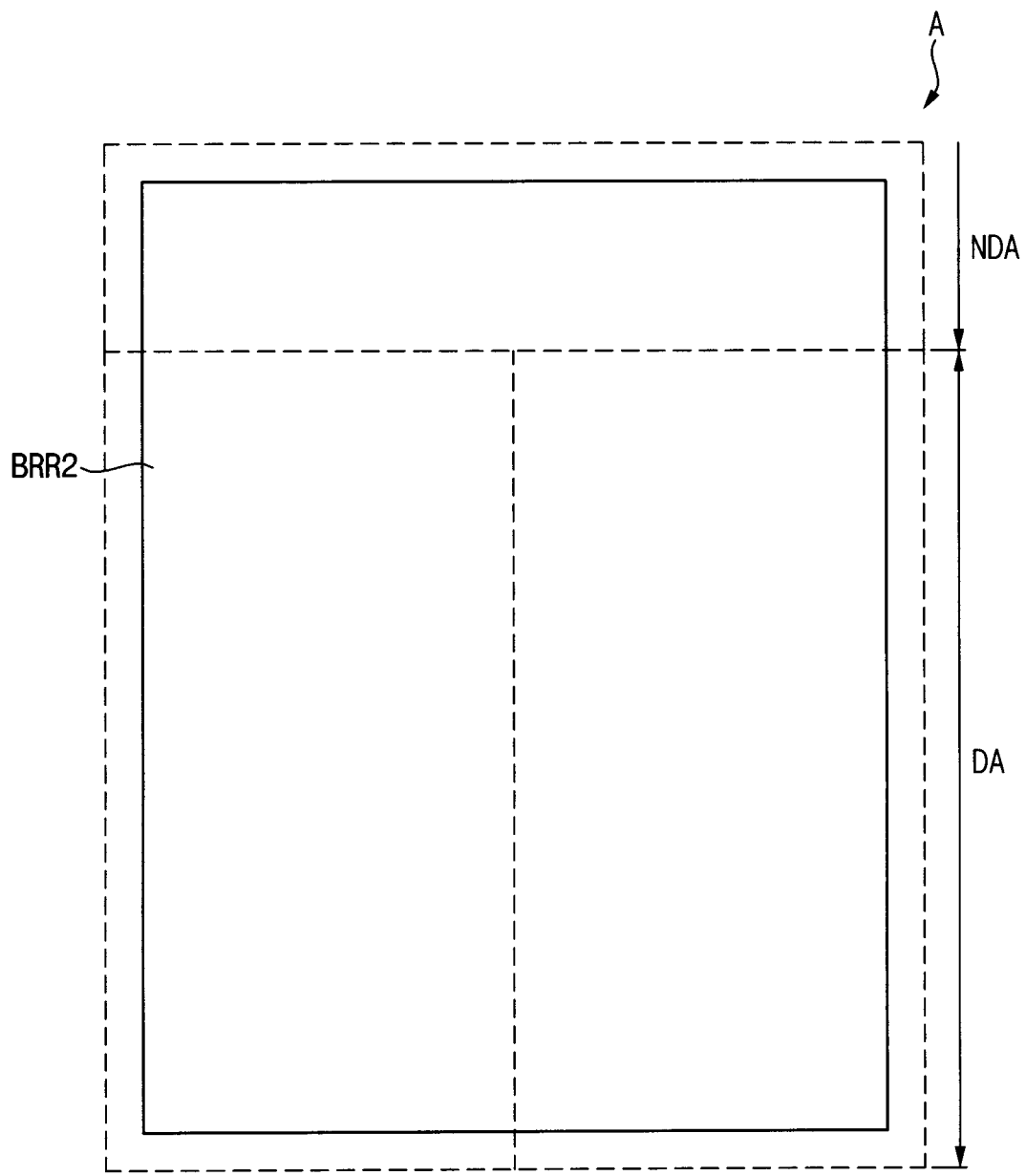

Referring to FIGS. 4 and 7, the first barrier layer BRR1 may be disposed on the first organic film layer PI1, the second organic film layer PI2 may be disposed on the first barrier layer BRR1, and the second barrier layer BRR2 may be disposed on the second organic film layer PI2.

The first organic film layer PI1 and the second organic film layer PI2 may include an organic material. In one embodiment, for example, the first organic film layer PI1 and the second organic film layer PI2 may include at least one selected from polyimide, polyethersulfone, polyacrylate, polyetherimide, polyethylene naphthalate, polyethylene terephthalate, polyphenylene sulfide, polyarylate, polycarbonate, and cellulose acetate propionate. In an embodiment, the first organic film layer PI1 may constitute or define the substrate of the display device 10. However, the invention is not limited thereto, and the first organic film layer PI1, the first barrier layer BRR1, and the second organic film layer PI2 may constitute or collectively define the substrate of the display device 10.

The first barrier layer BRR1 and the second barrier layer BRR2 may include an inorganic material. In one embodiment, for example, the first barrier layer BRR1 and the second barrier layer BRR2 may include at least one selected from silicon oxide, silicon nitride, silicon oxynitride mole, amorphous silicon, and the like. In an embodiment, the second barrier layer BRR2 may protect the second organic film layer PI2 which may be damaged in the process of forming the first lower pattern LP1.

Figure 8:
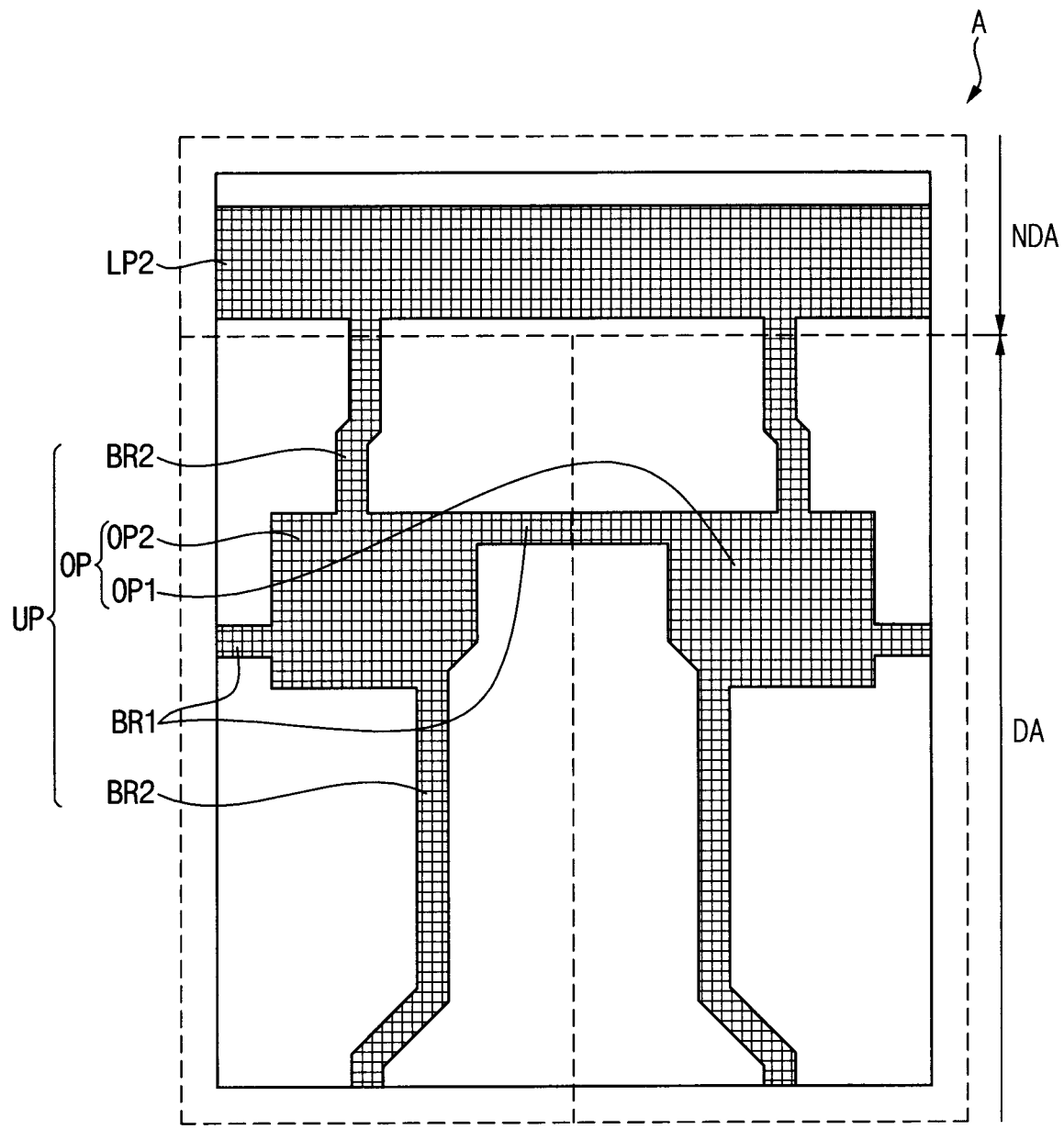
Figure 9:
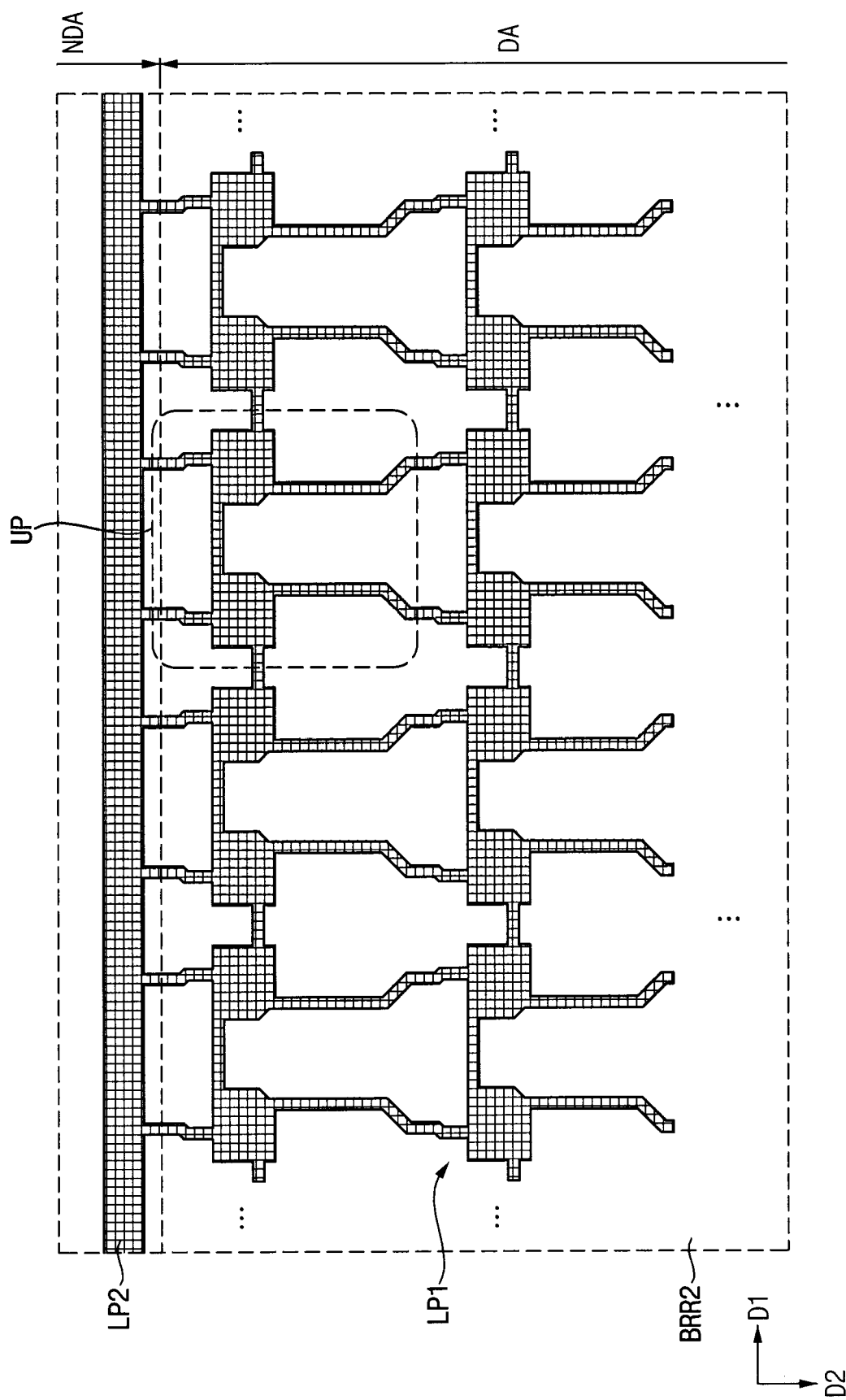

Referring to FIGS. 4, 8, and 9, the first lower pattern LP1 and the second lower pattern LP2 may be disposed on the second barrier layer BRR2. In an embodiment, the second lower pattern LP2 may be disposed in a same layer as the first lower pattern LP1 and may be integrally formed with the first lower pattern LP1 as a single unitary unit.

The first lower pattern LP1 may be disposed in the display area DA. In an embodiment, the first lower pattern LP1 may include a plurality of unit patterns UP. Each of the unit patterns UP may include an overlap pattern OP, first bridges BR1, and second bridges BR2.

In an embodiment, the overlap patterns OP may have an island shape. In such an embodiment, the overlap patterns OP may include a first overlap pattern OP1 and a second overlap pattern OP2. The second overlap pattern OP2 may be symmetrical with the first overlap pattern OP1 with respect to an axis in the second direction D2. The first overlap pattern OP1 and the second overlap pattern OP2 may be alternately arranged with each other along the first direction D1. In an embodiment, the first overlap pattern OP1 may be arranged side by side along the second direction D2, and the second overlap pattern OP2 may be arranged side by side along the second direction D2.

In an embodiment, the first bridges BR1 may extend along the first direction D1 and may connect the overlap patterns OP to each other. In one embodiment, for example, the first bridges BR1 may connect the first overlap pattern OP1 and the second overlap pattern OP2 which are alternately arranged along the first direction D1.

In an embodiment, the second bridges BR2 may extend along the second direction D2 and may connect the overlap patterns OP to each other. In one embodiment, for example, the second bridges BR2 may connect the first overlap pattern OP1 arranged side by side along the second direction D2, and may connect the second overlap pattern OP2 arranged side by side along the second direction D2.

In an embodiment, as shown in FIG. 9, the first lower pattern LP1 may have a mesh shape in which the unit patterns UP are repeatedly arranged.

In an embodiment, the second lower pattern LP2 may be disposed in the non-display area NDA. In one embodiment, for example, the second lower pattern LP2 may have a constant width in the second direction D2 and may extend along the first direction D1. In an embodiment, the second lower pattern LP2 may be connected to the first lower pattern LP1 through the second bridges BR2. Accordingly, the second lower pattern LP2 may be integrally formed with the first lower pattern LP1 as a single unitary unit. In an alternative embodiment, the second lower pattern LP2 may be disposed in the display area DA.

In an embodiment, the first and second lower patterns LP1 and LP2 may include a silicon semiconductor. In one embodiment, for example, the first and second lower patterns LP1 and LP2 may include amorphous silicon or polycrystalline silicon. In an embodiment, the first and second lower patterns LP1 and LP2 may be doped with positive or negative ions. In one embodiment, for example, the positive ions may be a group III element, boron, or the like. The negative ions may be a group V element, phosphorus, or the like.

In another embodiment, the first and second lower patterns LP1 and LP2 may include a metal. In one embodiment, for example, the first and second lower patterns LP1 and LP2 may include a metal (e.g., molybdenum (Mo)) included in the first conductive pattern 1200.

In an embodiment, a constant voltage may be provided to the first and second lower patterns LP1 and LP2. In one embodiment, for example, the power voltage ELVDD may be provided to the first and second lower patterns LP1 and LP2. In such an embodiment, the second lower pattern LP2 may allow the power voltage ELVDD to be uniformly provided to the first lower pattern LP1. In an alternative embodiment, the first and second lower patterns LP1 and LP2 may be electrically floating. In another alternative embodiment, an alternating current ("AC") voltage may be provided to the first and second lower patterns LP1 and LP2.

Figure 10:
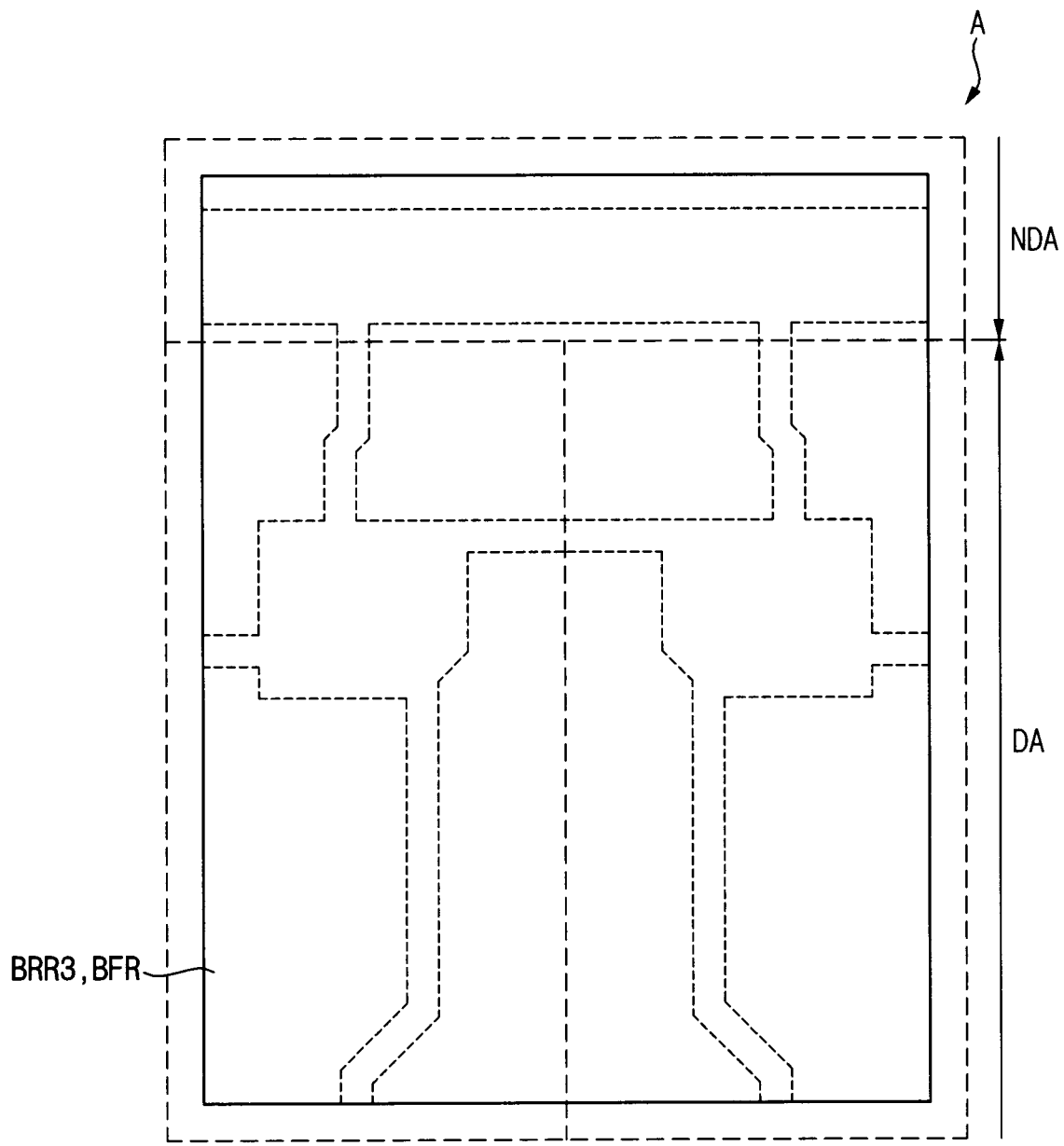

Referring to FIGS. 4 and 10, the third barrier layer BRR3 may be disposed on the first and second lower patterns LP1 and LP2, and a buffer layer BFR may be disposed on the third barrier layer BRR3.

The third barrier layer BRR3 may cover the first and second lower patterns LP1 and LP2. The third barrier layer BRR3 may include substantially a same material as the first barrier layer BRR1 and/or the second barrier layer BRR2.

In an embodiment, the buffer layer BFR may prevent metal atoms or impurities from diffusing into the first active pattern 1100. In an embodiment, the buffer layer BFR may control a rate of providing heat during a crystallization process for forming the first active pattern 1100.

Figure 11:
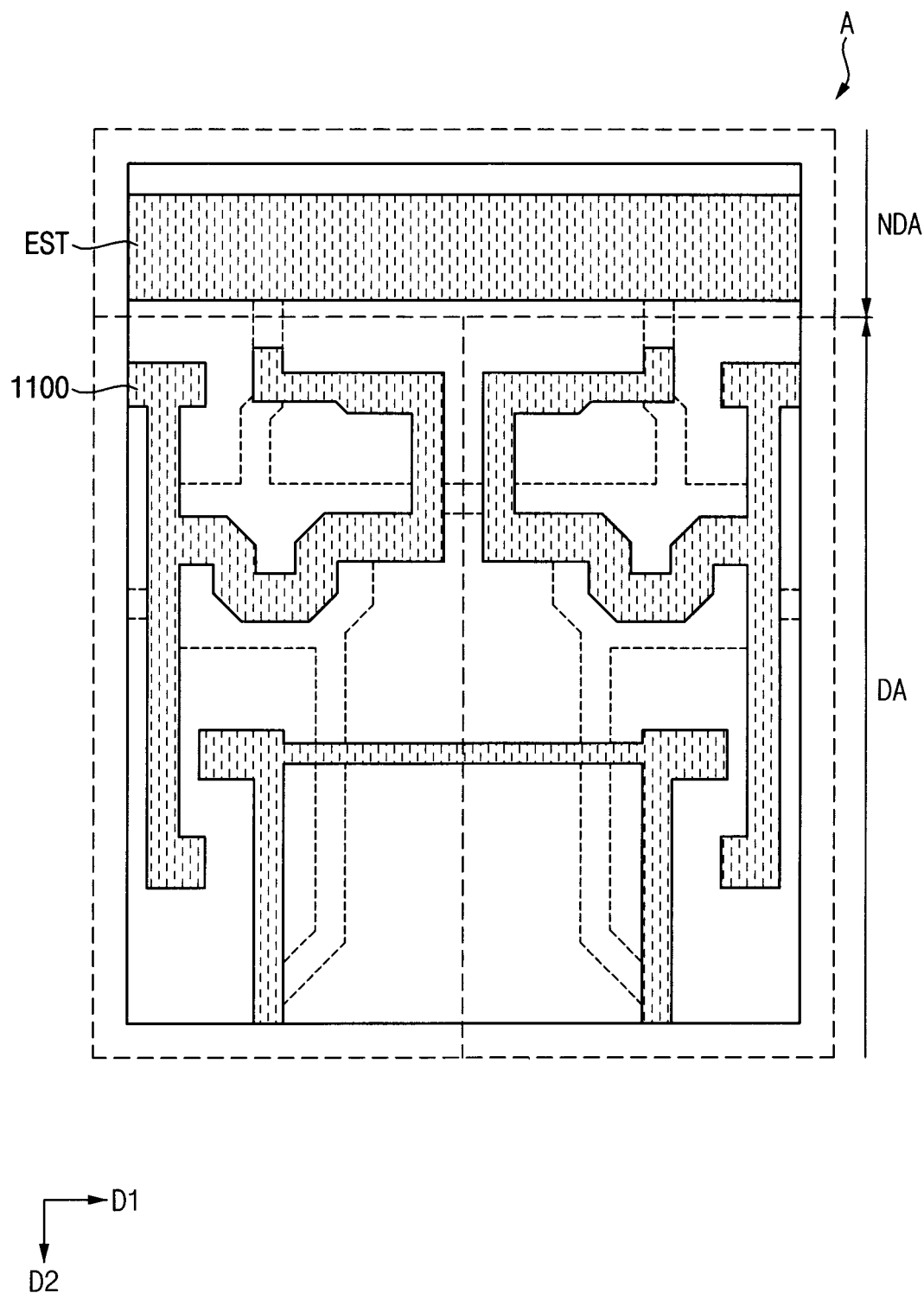

Referring to FIGS. 4 and 11, the first active pattern 1100 and the etch stopper EST may be disposed on the buffer layer BFR. The first active pattern 1100 may be disposed in the display area DA and the etch stopper EST may be disposed in the non-display area NDA.

The first active pattern 1100 may overlap the first lower pattern LP1. In an embodiment, the first active pattern 1100 may include a silicon semiconductor. In one embodiment, for example, the first active pattern 1100 may include amorphous silicon, polycrystalline silicon, or the like.

In an embodiment, positive ions or negative ions may be selectively injected into the first active pattern 1100. In one embodiment, for example, when the first, second, fifth, sixth, and seventh transistors T1, T2, T5, T6, and T7 are PMOS transistors, the first active pattern 1100 may include a source region having a high concentration of positive ions, a drain region having a high concentration of positive ions, and a channel region having a low concentration of positive ions.

The etch stopper EST may overlap the second lower pattern LP2. In an embodiment, the etch stopper EST may include a same material as the first active pattern 1100. In one embodiment, for example, the etch stopper EST may include a silicon semiconductor (e.g., amorphous silicon or polycrystalline silicon formed by crystallizing the amorphous silicon). Alternatively, the etch stopper EST may include an oxide semiconductor.

In an embodiment, the etch stopper EST may be formed together with (or during a same process as) the first active pattern 1100. In one embodiment, for example, an active layer may be formed on the buffer layer BFR. As the active layer is patterned, the first active pattern 1100 and the etch stopper EST may be formed together. In an embodiment, the etch stopper EST may not be connected to the first active pattern 1100. In such an embodiment, the etch stopper EST may be electrically insulated from the first active pattern 1100.

The first gate insulating layer GI1 may cover the first active pattern 1100 and the etch stopper EST, and may be disposed on the buffer layer BFR. The first gate insulating layer GI1 may include an insulating material. In one embodiment, for example, the first gate insulating layer GI1 may have a single layer or multilayer structure including or formed of silicon oxide, silicon nitride, silicon oxynitride, or the like.

Figure 12:
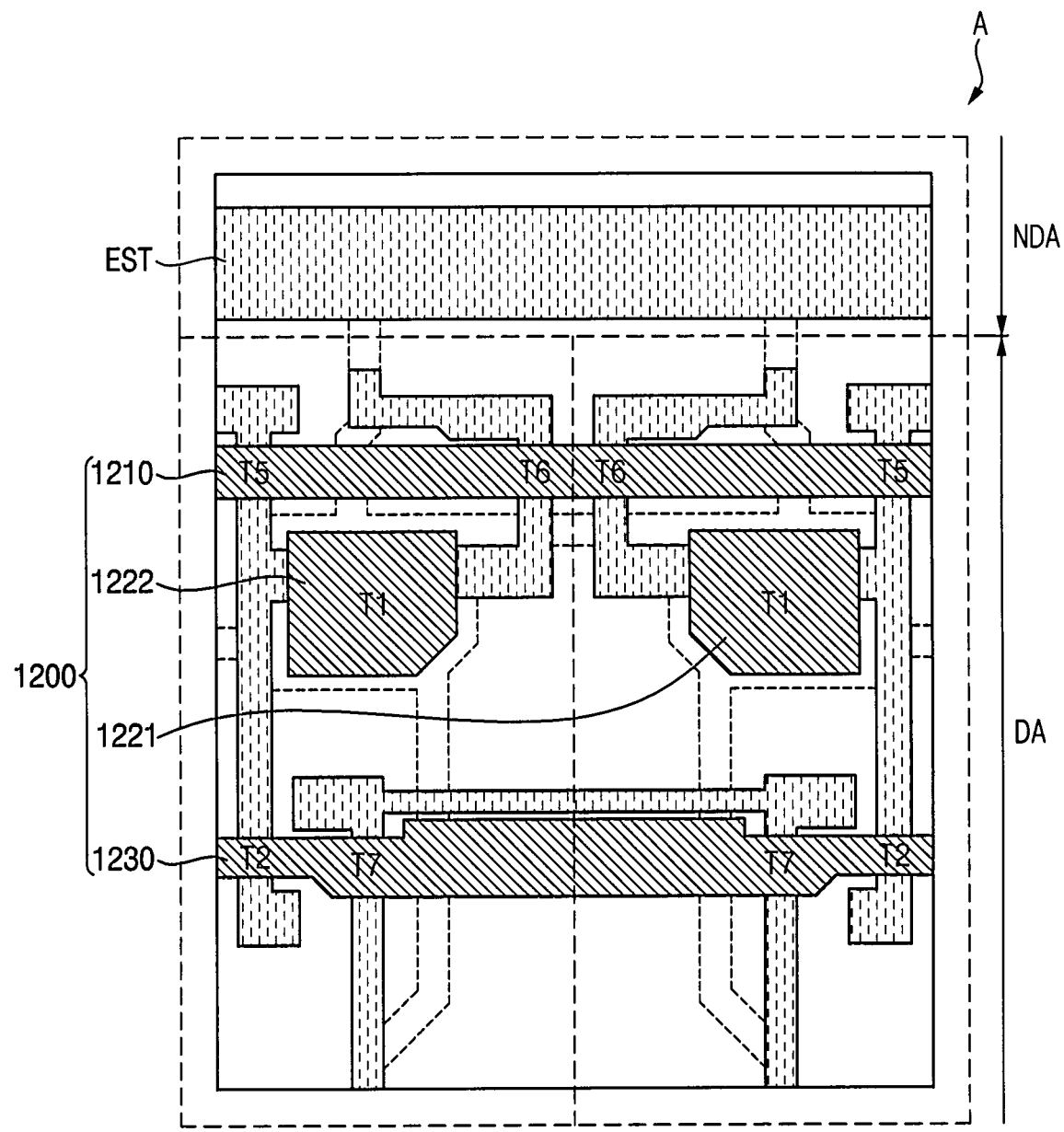
Figure 13:
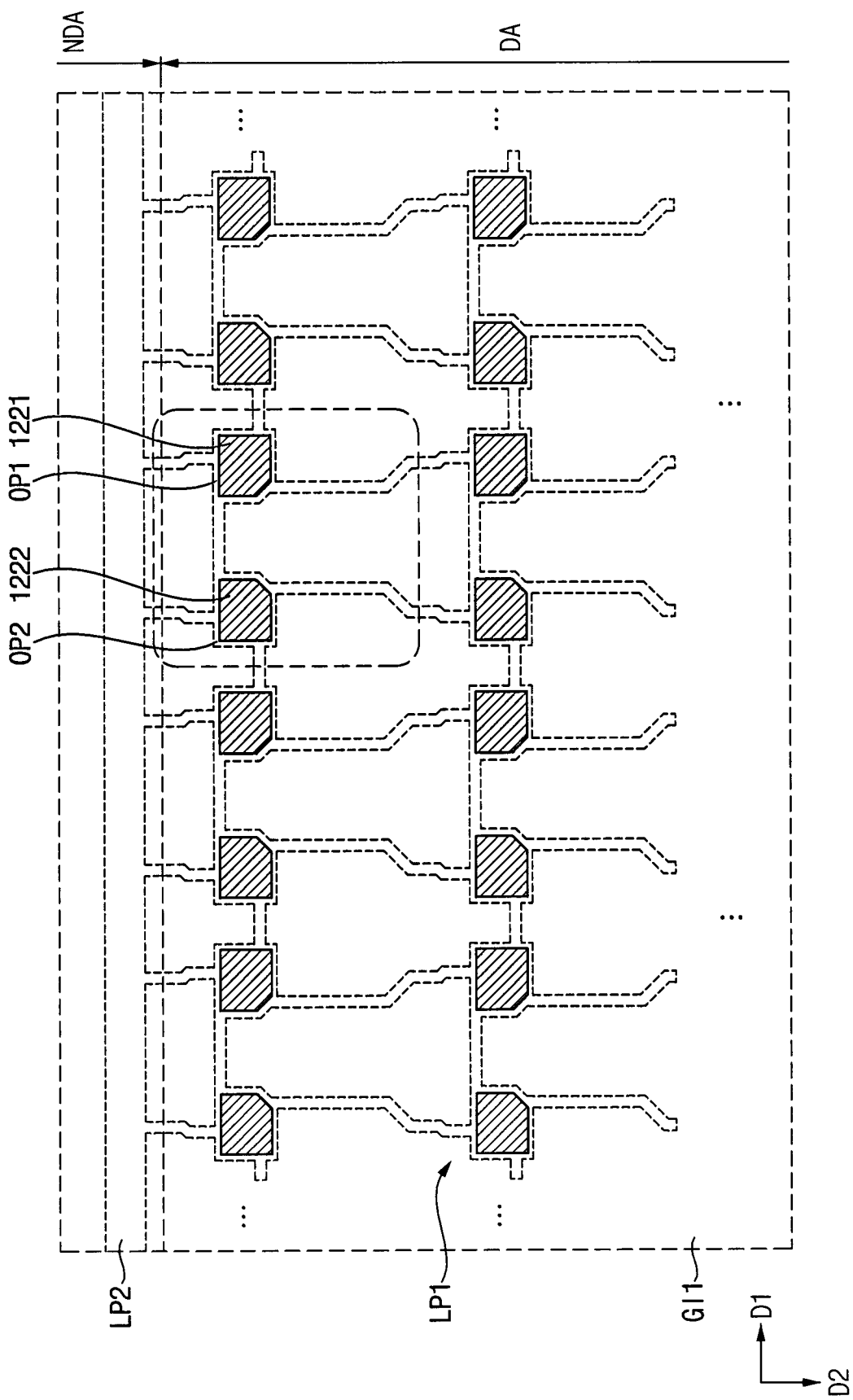

Referring to FIGS. 4, 12, and 13, the first conductive pattern 1200 may be disposed on the first gate insulating layer GI1. The first conductive pattern 1200 may include a first gate line 1210, a first gate electrode 1221, a second gate electrode 1222, and a second gate line 1230.

The first gate line 1210 may be disposed on the first active pattern 1100 and may extend along the first direction D1. In an embodiment, the first gate line 1210 may be adjacent to one side of the first gate electrode 1221 on a plane or when viewed in a plan view. The first gate line 1210 may constitute the fifth and sixth transistors T5 and T6 together with the first active pattern 1100. The emission control signal EM may be provided to the first gate line 1210. In such an embodiment, the first gate line 1210 may be referred to as an emission control line.

FIG. 13 may be a plan view illustrating a plurality of gate electrodes and the first lower pattern LP1. In an embodiment, as shown in FIG. 13, a plurality of gate electrodes may be arranged in a matrix shape. The gate electrodes may be disposed for each of the pixel circuit parts. In an embodiment, the gate electrodes may overlap the overlap patterns OP. In one embodiment, for example, the gate electrodes may include the first gate electrode 1221 and the second gate electrode 1222. The first gate electrode 1221 may overlap the first overlap pattern OP1, and the second gate electrode 1222 may overlap the second overlap pattern OP2.

The first gate electrode 1221 may constitute the first transistor T1 included in the first pixel circuit part PCP1 together with the first active pattern 1100. The second gate electrode 1222 may constitute a first transistor included in the second pixel circuit part PCP2 together with the first active pattern 1100.

The second gate line 1230 may be disposed on the first active pattern 1100 and may extend along the first direction D1. In one embodiment, for example, the second gate line 1230 may constitute the second transistor T2 together with the first active pattern 1100. The first gate signal GW may be provided to the second gate line 1230.

In an embodiment, the second gate line 1230 may constitute the seventh transistor T7 together with the first active pattern 1100. The fourth gate signal GB may be provided to the second gate line 1230. In one embodiment, for example, the first gate signal GW and the fourth gate signal GB may have substantially a same waveform as each other with a time difference.

In one embodiment, for example, the first conductive pattern 1200 may include a metal such as molybdenum (Mo), aluminum (Al), copper (Cu), titanium (Ti), an alloy, a conductive metal oxide, a transparent conductive material, etc.

The second gate insulating layer GI2 may cover the first conductive pattern 1200 and may be disposed on the first gate insulating layer GI1. The second gate insulating layer GI2 may have a single layer or multilayer structure including or formed of silicon oxide, silicon nitride, silicon oxynitride, or the like.

In such an embodiment, the first, second, fifth, sixth, and seventh transistors T1, T2, T5, T6, and T7 may substantially correspond to the first, second, fifth, sixth, and seventh transistors T1, T2, T5, T6, and T7 described with reference to FIG. 3. In one embodiment, for example, the first gate electrode 1221 may correspond to the gate terminal of the first transistor T1 described with reference to FIG. 3. However, the above-described correspondence will be apparent to those skilled in the art to which the invention.

Figure 14:
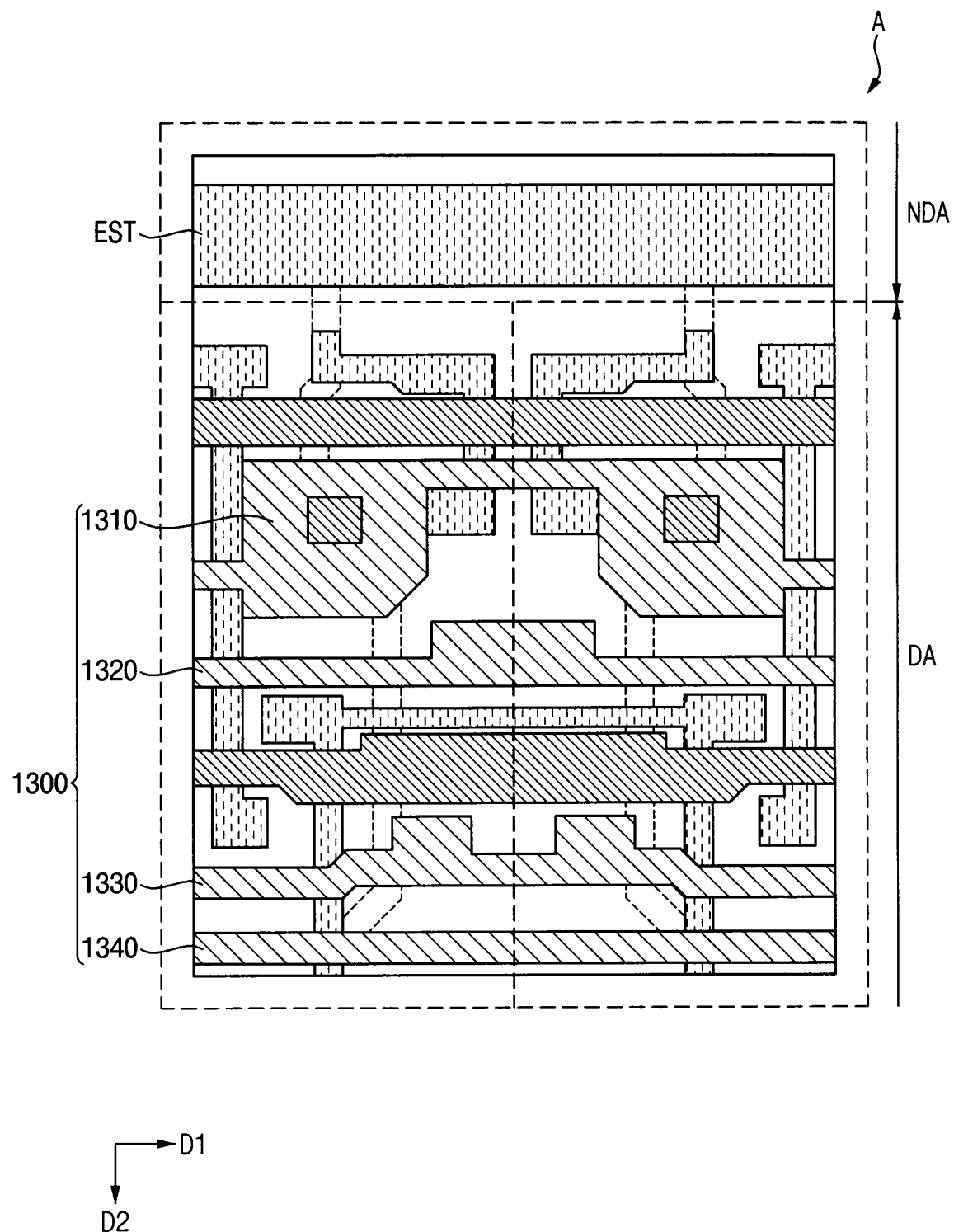

Referring to FIGS. 4 and 14, the second conductive pattern 1300 may be disposed on the second gate insulating layer GI2. The second conductive pattern 1300 may include a storage capacitor electrode 1310, a third gate line 1320, a fourth gate line 1330, and a gate initialization voltage line 1340.

The storage capacitor electrode 1310 may extend along the first direction D1. In an embodiment, the storage capacitor electrode 1310 may constitute the storage capacitor CST included in the first pixel circuit part PCP1 together with the first gate electrode 1221. In one embodiment, for example, the storage capacitor electrode 1310 may overlap the first gate electrode 1221, and the power voltage ELVDD may be provided to the storage capacitor electrode 1310.

In such an embodiment, the storage capacitor electrode 1310 may constitute the storage capacitor CST included in the second pixel circuit part PCP2 together with the second gate electrode 1222. In one embodiment, for example, the storage capacitor electrode 1310 may overlap the second gate electrode 1222.

In an embodiment, openings exposing upper surfaces of the first and second gate electrodes 1221 and 1222 may be defined or formed in the storage capacitor electrode 1310.

The third gate line 1320 may extend along the first direction D1. In an embodiment, the third gate line 1320 may be adjacent to another side opposite to the one side of the first gate electrode 1221 on a plane or when viewed in a plan view. In an embodiment, the third gate line 1320 may provide the second gate signal GC to the third transistor T3. In one embodiment, for example, the third gate line 1320 may correspond to the bottom gate terminal of the third transistor T3. In such an embodiment, the third gate line 1320 may be referred to as a bottom compensation control line.

The fourth gate line 1330 may extend along the first direction D1. In an embodiment, the fourth gate line 1330 may provide the third gate signal GI to the fourth transistor T4. In one embodiment, for example, the fourth gate line 1330 may correspond to the bottom gate terminal of the fourth transistor T4.

The gate initialization voltage line 1340 may extend along the first direction D1. In an embodiment, the gate initialization voltage line 1340 may provide the gate initialization voltage VINT to the fourth transistor T4. In one embodiment, for example, the gate initialization voltage line 1340 may be electrically connected to the second active pattern 1400.

In one embodiment, for example, the second conductive pattern 1300 may include a metal such as molybdenum (Mo), aluminum (Al), copper (Cu), titanium (Ti), an alloy, a conductive metal oxide, a transparent conductive material, etc.

The first interlayer insulating layer ILD1 may cover the second conductive pattern 1300 and may be disposed on the second gate insulating layer GI2. The first interlayer insulating layer ILD1 may include an insulating material.

Figure 15:
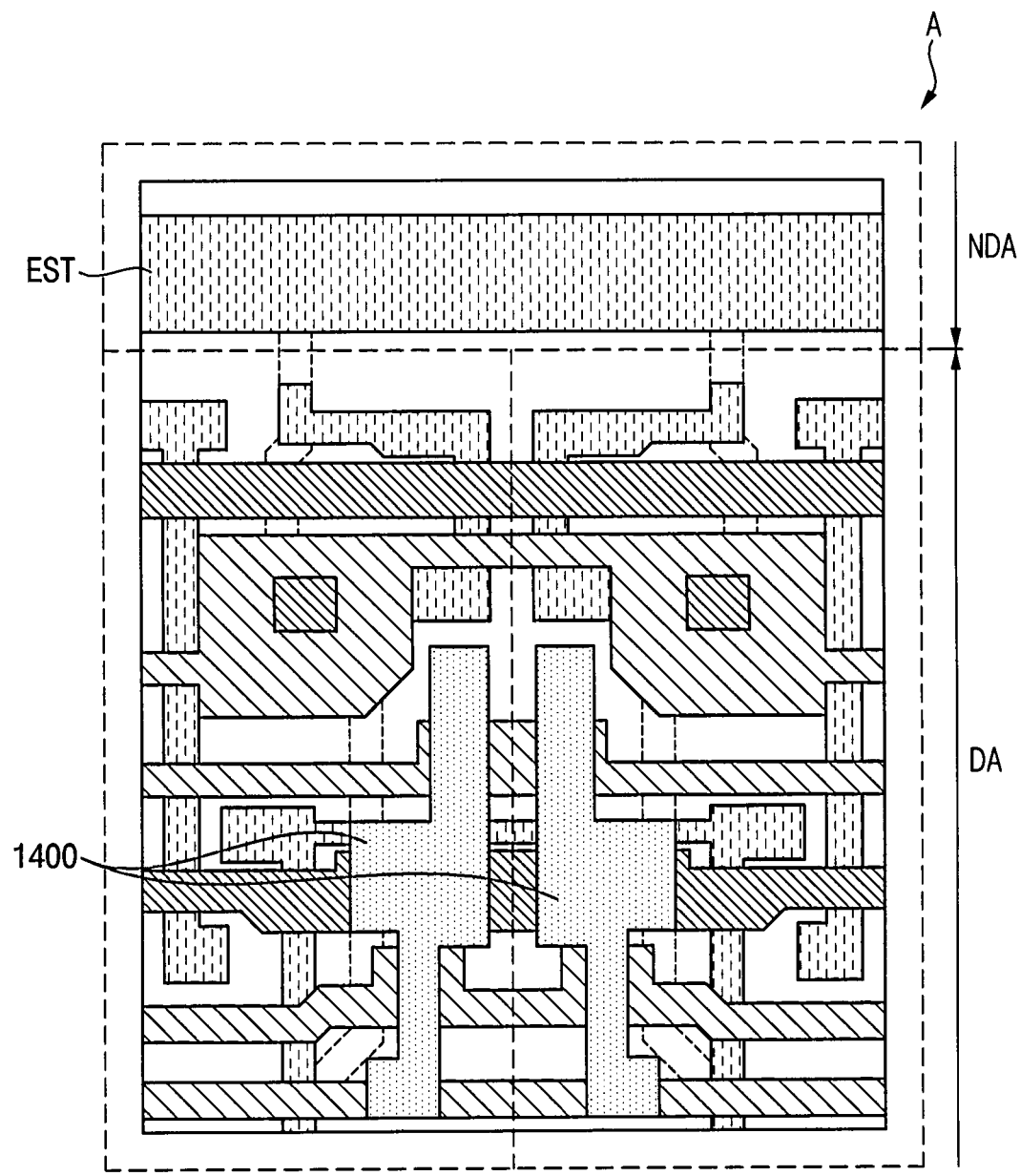

Referring to FIGS. 4 and 15, the second active pattern 1400 may be disposed on the first interlayer insulating layer ILD1. In one embodiment, for example, the second active pattern 1400 may overlap the third gate line 1320, the fourth gate line 1330, and the gate initialization line 1340.

In an embodiment, the second active pattern 1400 may be disposed in a different layer from the first active pattern 1100 and may not overlap the first active pattern 1100. In such an embodiment, the second active pattern 1400 may be formed separately from the first active pattern 1100. In one embodiment, for example, the first active pattern 1100 may include the silicon semiconductor, and the second active pattern 1400 may include the oxide semiconductor.

In an embodiment, the first pixel circuit part PCP1 may include the first, second, fifth, sixth, and seventh transistors T1, T2, T5, T6, and T7 which are silicon-based semiconductor transistors, and the third and fourth transistor T3 and T5 which are oxide-based semiconductor transistors. In one embodiment, for example, the first, second, fifth, sixth, and seventh transistors T1, T2, T5, T6, and T7 may be PMOS transistors, and the third and fourth transistors T3 and T4 may be NMOS transistors.

The third gate insulating layer GI3 may cover the second active pattern 1400 and may be disposed on the first interlayer insulating layer ILD1. The third gate insulating layer GI3 may have a single layer or multilayer structure including or formed of silicon oxide, silicon nitride, silicon oxynitride, or the like.

Figure 16:
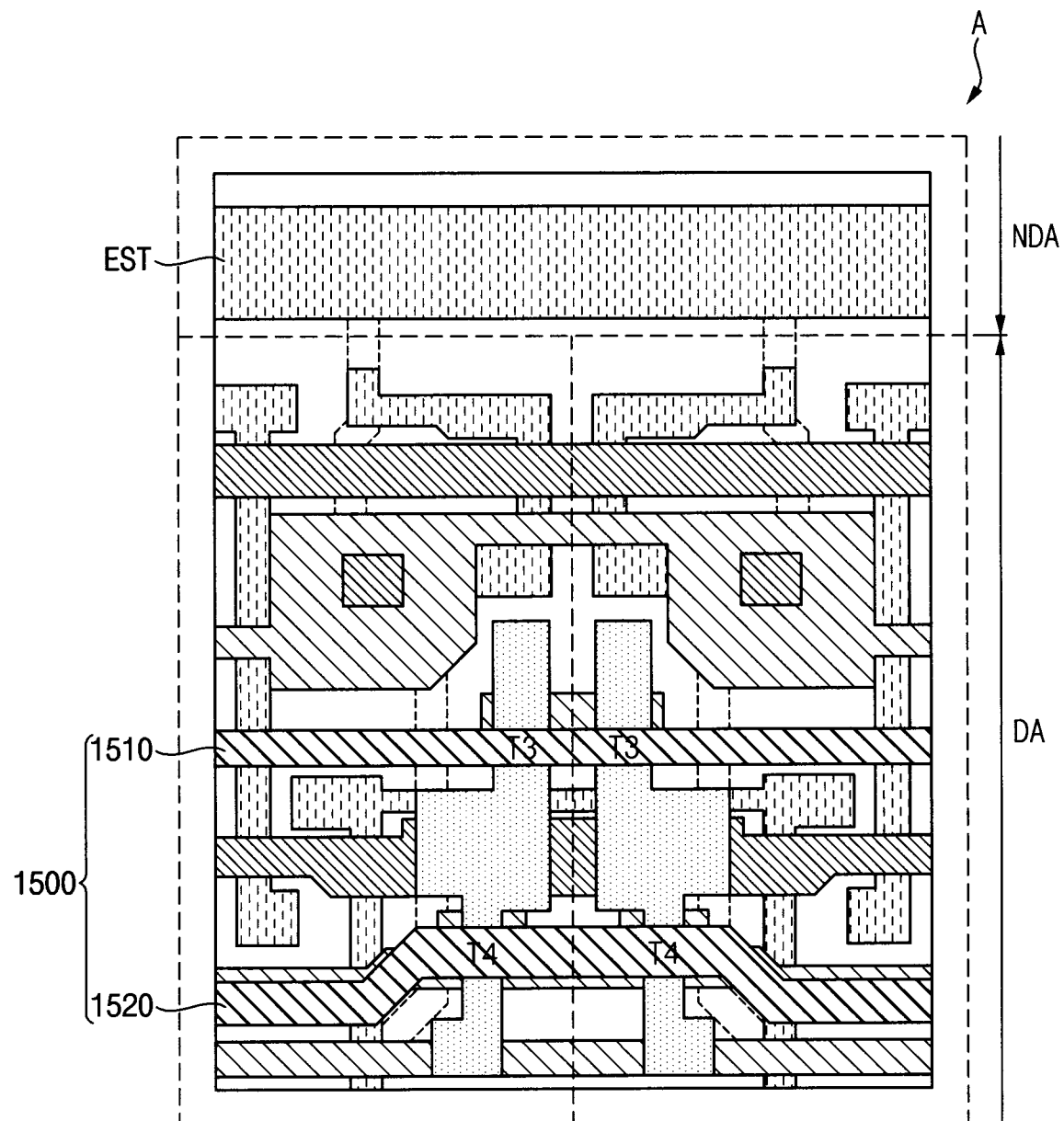

Referring to FIGS. 4 and 16, the third conductive pattern 1500 may be disposed on the third gate insulating layer GI3. The third conductive pattern 1500 may include a fifth gate line 1510 and a sixth gate line 1520.

The fifth gate line 1510 may extend along the first direction D1. In one embodiment, for example, the fifth gate line 1510 may overlap the third gate line 1320 and may be electrically connected to the third gate line 1320. In an embodiment, the fifth gate line 1510 may provide the second gate signal GC to the third transistor T3. Accordingly, the fifth gate line 1510 may correspond to the gate terminal of the third transistor T3. In such an embodiment, the fifth gate line 1510 may be referred to as a top compensation control line.

The sixth gate line 1520 may extend along the first direction D1. In one embodiment, for example, the sixth gate line 1520 may overlap the fourth gate line 1330 and may be electrically connected to the fourth gate line 1330. In an embodiment, the sixth gate line 1520 may provide the third gate signal GI to the fourth transistor T4. Accordingly, the sixth gate line 1520 may correspond to the gate terminal of the fourth transistor T4.

In one embodiment, for example, the third conductive pattern 1500 may include a metal, an alloy, a conductive metal oxide, a transparent conductive material, and the like.

The second interlayer insulating layer ILD2 may cover the third conductive pattern 1500 and may be disposed on the first interlayer insulating layer ILD1. The second interlayer insulating layer ILD2 may include an insulating material.

Figure 17:
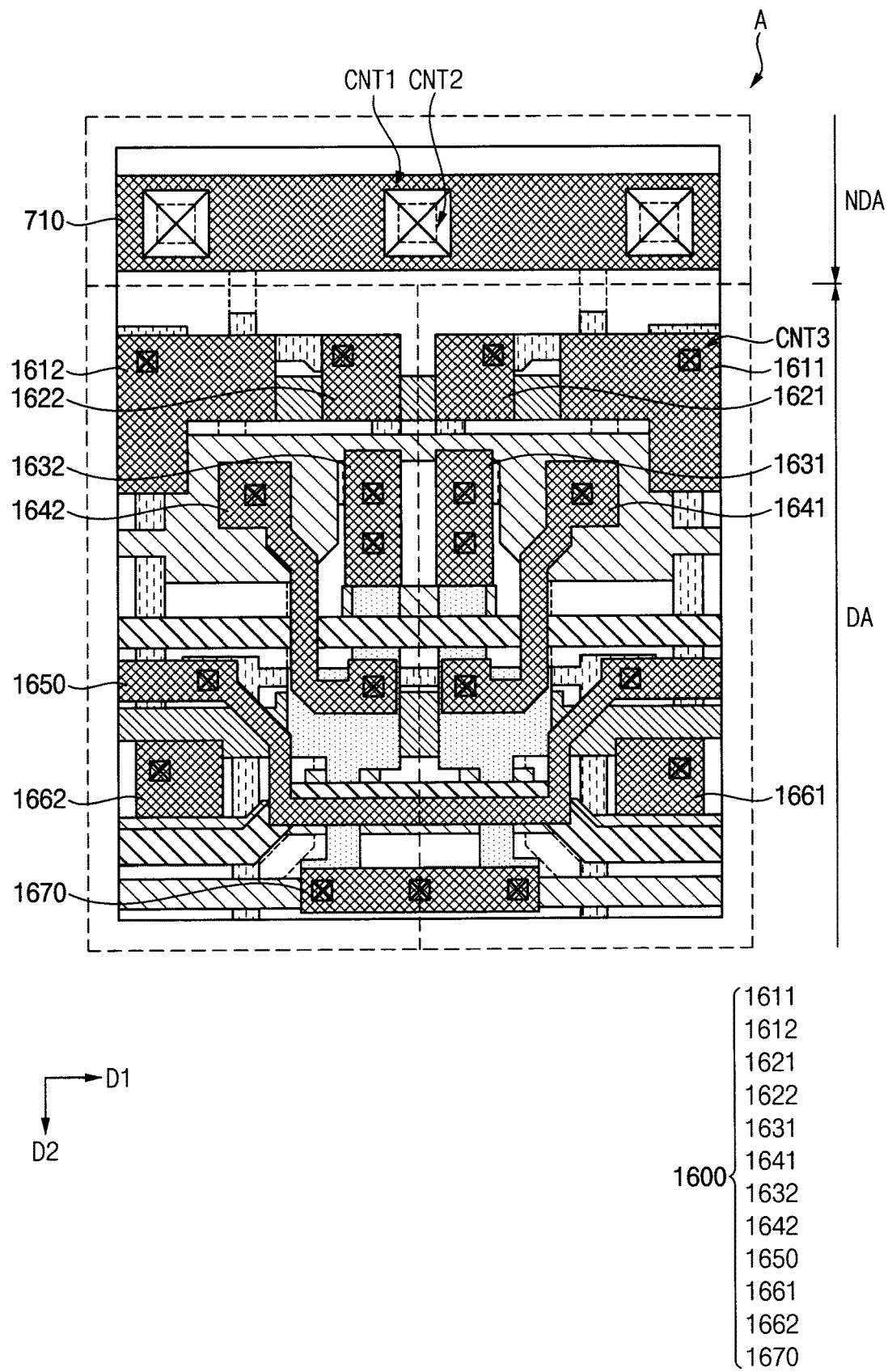

Referring to FIGS. 4 and 17, the fourth conductive pattern 1600 and a first pattern 710 may be disposed on the second interlayer insulating layer ILD2. The fourth conductive pattern 1600 may include a first power voltage connection pattern 1611, a second power voltage connection pattern 1612, a first anode pattern 1621, a second anode pattern 1622, a first compensation connection pattern 1631, a second compensation connection pattern 1632, a first initialization connection pattern 1641, a second initialization connection pattern 1642, an anode initialization voltage line 1650, a first data pattern 1661, a second data pattern 1662, and a gate initialization voltage pattern 1670.

The first and second power voltage connection patterns 1611 and 1612 may transfer the power voltage EVLDD to the first active pattern 1100. In an embodiment, the first and second power voltage connection patterns 1611 and 1612 may electrically connect a power voltage line (e.g., a power voltage line 1720 in FIG. 18) and the first active pattern 1100 to each other. In one embodiment, for example, the first and second power voltage connection patterns 1611 and 1612 may contact the power voltage line 1720 and the first active pattern 1100.

The first anode pattern 1621 may provide the anode initialization voltage AINT or the driving current to the first emitting diode ED1 connected to the first pixel circuit part PCP1. In one embodiment, for example, the first anode pattern 1621 may contact the first active pattern 1100 and the third anode pattern (e.g., a third anode pattern 1731 in FIG. 18).

The second anode pattern 1622 may provide the anode initialization voltage AINT or the driving current to the second emitting diode ED2 connected to the second pixel circuit part PCP2. In one embodiment, for example, the second anode pattern 1622 may contact the first active pattern 1100 and the fourth anode pattern (e.g., a fourth anode pattern 1732 in FIG. 18).

The first compensation connection pattern 1631 may electrically connect the second terminal of the first transistor T1 and the first terminal of the third transistor T3, which are included in the first pixel circuit part PCP1, to each other. In one embodiment, for example, the first compensation connection pattern 1631 may contact the first active pattern 1100 and the second active pattern 1400.

The second compensation connection pattern 1632 may electrically connect the second terminal of the first transistor T1 and the first terminal of the third transistor T3, which are included in the second pixel circuit part PCP2, to each other. In one embodiment, for example, the second compensation connection pattern 1632 may contact the first active pattern 1100 and the second active pattern 1400.

The first initialization connection pattern 1641 may electrically connect the gate terminal of the first transistor T1 and the first terminal of the fourth transistor T4, which are included in the first pixel circuit part PCP1, to each other. In one embodiment, for example, the first initialization connection pattern 1641 may contact the second active pattern 1400 and the first gate electrode 1221.

The second initialization connection pattern 1642 may electrically connect the gate terminal of the first transistor T1 and the first terminal of the fourth transistor T4, which are included in the second pixel circuit part PCP2, to each other. In one embodiment, for example, the second initialization connection pattern 1642 may contact the second active pattern 1400 and the second gate electrode 1222.

The anode initialization voltage line 1650 may provide the anode initialization voltage AINT to the seventh transistor T7. In one embodiment, for example, the anode initialization voltage line 1650 may contact the first active pattern 1100.

The first data pattern 1661 may provide the data voltage DATA to the second transistor T2 included in the first pixel circuit part PCP1. In one embodiment, for example, the first data pattern 1661 may contact the first active pattern 1100 and a first data line (e.g., a first data line 1711 in FIG. 18).

The second data pattern 1662 may provide the data voltage DATA to the second transistor T2 included in the second pixel circuit part PCP2. In one embodiment, for example, the second data pattern 1662 may contact the first active pattern 1100 and a second data line (e.g., a second data line 1712 in FIG. 18).

The gate initialization voltage pattern 1670 may provide the gate initialization voltage VINT to the fourth transistor T4. In one embodiment, for example, the gate initialization voltage pattern 1670 may provide the gate initialization voltage VINT to the second active pattern 1400. The gate initialization voltage pattern 1670 may contact the gate initialization voltage line 1340 and the second active pattern 1400.

The fourth conductive pattern 1600 may contact a conductive pattern or an active pattern which are disposed under the fourth conductive pattern 1600 through a plurality of contact holes. In one embodiment, for example, the first power voltage connection pattern 1611 may directly contact the first active pattern 1100 through a third contact hole CNT3.

The first pattern 710 may be disposed along the non-display area NDA. In one embodiment, for example, the first pattern 710 may have a constant width in the second direction D2 and may extend along the first direction D1. In an embodiment, the first pattern 710 may be formed together with the fourth conductive pattern 1600.

In an embodiment, the first pattern 710 may directly contact the second lower pattern LP2 through a first contact hole CNT1 and a second contact hole CNT2. In one embodiment, for example, the first contact hole CNT1 may expose the etch stopper EST. The second contact hole CNT2 may be connected to the first contact hole CNT2, may be defined through the etch stopper EST, and expose the second lower pattern LP2. In an embodiment, a plane area of the second contact hole CNT2 may be smaller than a plane area of the first contact hole CNT1.

In one embodiment, for example, the fourth conductive pattern 1600 and the first pattern 710 may include at least one selected from a metal, an alloy, a conductive metal oxide, a transparent conductive material, and the like.

The first via insulating layer VIA1 may cover the fourth conductive pattern 1600 and may be disposed on the second interlayer insulating layer ILD2. The first via insulating layer VIA1 may include an organic insulating material. In one embodiment, for example, the first via insulating layer VIA1 may include a photoresist, a polyacrylic resin, a polyimide resin, an acrylic resin, or the like.

Figure 18:
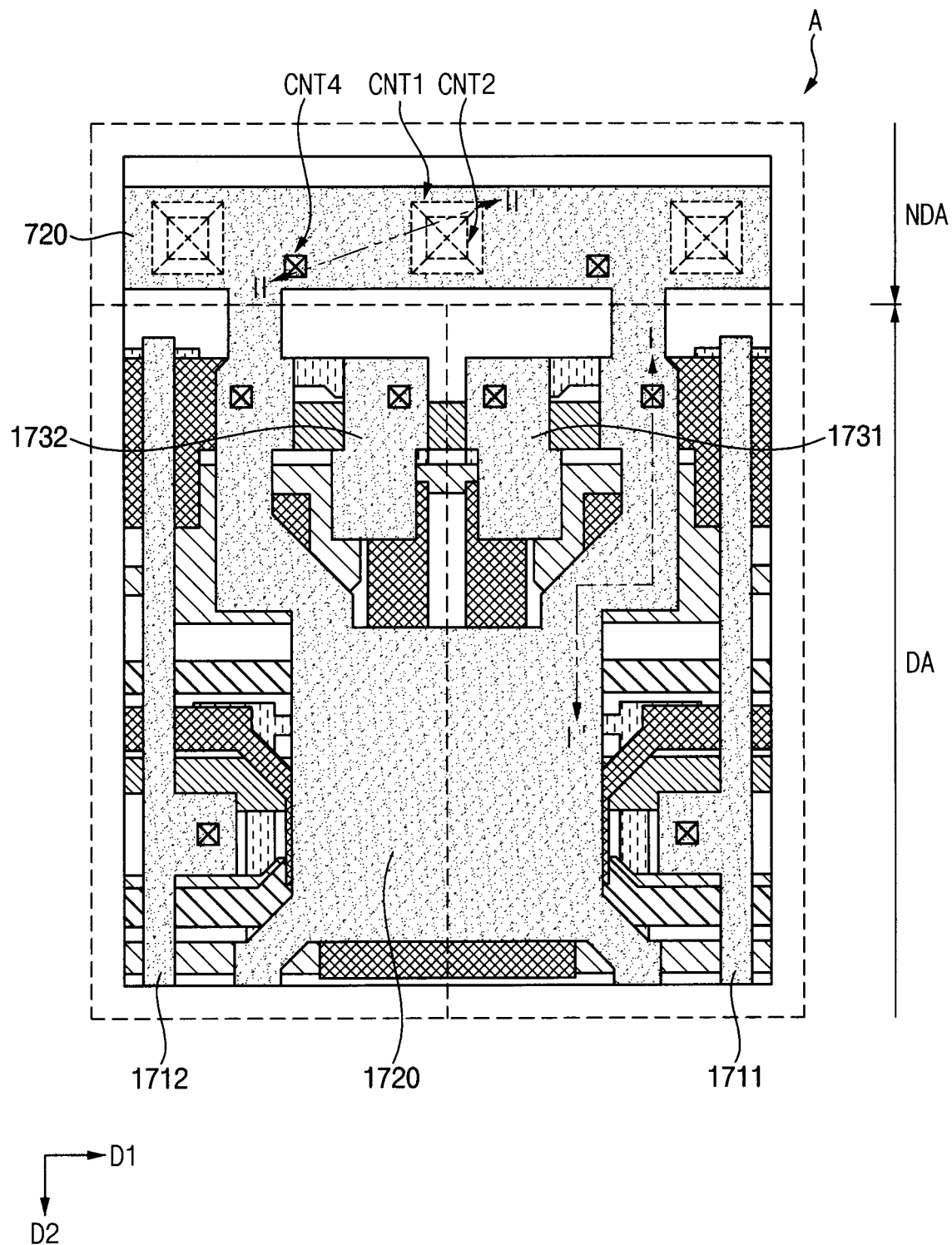
Figure 19:
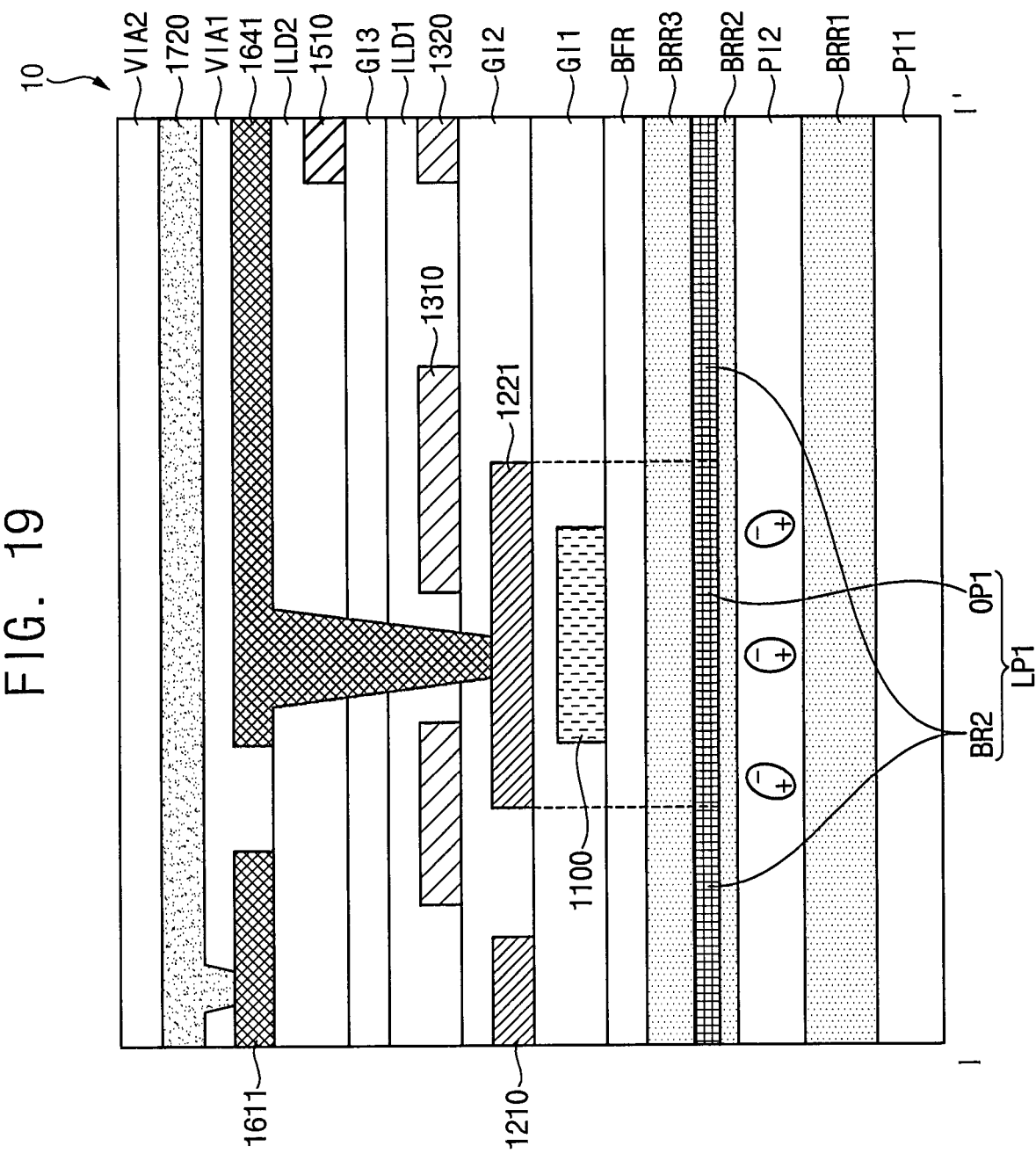
FIG. 19 is a cross-sectional view taken along line I-I' of FIG. 18.

Referring to FIGS. 4 and 18, the fifth conductive pattern 1700 and a second pattern 720 may be disposed on the first via insulating layer VIAL The fifth conductive pattern 1700 may include a first data line 1711, a second data line 1712, a power voltage line 1720, a third anode pattern 1731, and a fourth anode pattern 1732.

The first data line 1711 may extend along the second direction D2. In an embodiment, the first data line 1711 may provide the data voltage DATA to the second transistor T2 included in the first pixel circuit part PCP1. In one embodiment, for example, the first data line 1711 may contact the first data pattern 1661.

The second data line 1712 may extend along the second direction D2. In an embodiment, the second data line 1712 may provide the data voltage DATA to the second transistor T2 included in the second pixel circuit part PCP2. In one embodiment, for example, the second data line 1712 may contact the second data pattern 1662.

The power voltage line 1720 may extend along the second direction D2. In an embodiment, the power voltage line 1720 may provide the power voltage ELVDD to the first and second power voltage connection patterns 1611 and 1612. In one embodiment, for example, the power voltage line 1720 may contact the first and second power voltage connection patterns 1611 and 1612.

The third anode pattern 1731 may provide the anode initialization voltage AINT or the driving current to the first emitting diode ED1 connected to the first pixel circuit part PCP1. In one embodiment, for example, the third anode pattern 1731 may contact the first anode pattern 1621.

The fourth anode pattern 1732 may provide the anode initialization voltage AINT or the driving current to the second emitting diode ED2 connected to the second pixel circuit part PCP2. In one embodiment, for example, the fourth anode pattern 1732 may contact the second anode pattern 1622.

The fifth conductive pattern 1700 may contact the fourth conductive pattern 1600 through a plurality of contact holes. In one embodiment, for example, the power voltage line 1720 may contact the first power voltage connection pattern 1611 through a contact hole.

The second pattern 720 may be disposed in the non-display area NDA. In one embodiment, for example, the second pattern 720 may have a constant width in the second direction D2 and may extend along the first direction D1. In an embodiment, the second pattern 720 may be formed together with the fifth conductive pattern 1700.

In an embodiment, the second pattern 720 may be connected to the power voltage line 1720. In one embodiment, for example, the second pattern 720 may be integrally formed with the power voltage line 1720 as a single unitary unit. In an embodiment, the second pattern 720 may directly contact the first pattern 710 through a fourth contact hole CNT4. Accordingly, the second pattern 720 may transfer the power voltage ELVDD between the power voltage line 1720 and the first pattern 710.

In one embodiment, for example, the fifth conductive pattern 1700 and the second pattern 720 may include at least one selected from a metal, an alloy, a conductive metal oxide, a transparent conductive material, and the like.

The second via insulating layer VIA2 may cover the fifth conductive pattern 1700 and the second pattern 720, and may be disposed on the first via insulating layer VIA1. The second via insulating layer VIA2 may include an organic insulating material. In one embodiment, for example, the second via insulating layer VIA2 may include a photoresist, a polyacrylic resin, a polyimide resin, an acrylic resin, or the like.

Referring to FIGS. 18 and 19, in an embodiment, the first lower pattern LP1 may overlap the first active pattern 1100, the first gate electrode 1221, and the power voltage line 1720. In such an embodiment, the first overlap pattern OP1 may overlap the first active pattern 1100 and the first gate electrode 1221, and the second bridges BR2 may overlap the power voltage line 1720. In such an embodiment, when viewed in a plan view, the first gate line 1210 may be adjacent to the one side of the first gate electrode 1221, and the third gate line 1320 and the fifth gate line 1510 may be adjacent to the other side of the first gate electrode 1221.

In an embodiment, as described above, the emission control signal EM may be provided to the first gate line 1210, and the second gate signal GC may be provided to the third gate line 1320 and the fifth gate line 1510. In such an embodiment, the emission control signal EM may have a negative voltage level to turn on the fifth and sixth transistors T5 and T6. At the same time, the second gate signal GC may have a negative voltage level to turn off the third transistor T3.

In a conventional display device, as the emission control signal EM and the second gate signal GC have a negative voltage level at the same time, an electric field may be formed in the second organic film layer PI2. Accordingly, organic materials included in the second organic film layer PI2 may be polarized such that a back channel may be formed in the first active pattern 1100 by the polarized organic materials. Thus, electrical characteristics (e.g., threshold voltage, electron mobility, etc.) of the first transistor T1 may be changed. Accordingly, the first and second pixel structures including the first transistor T1 whose electrical characteristics are changed may emit luminance not corresponding to the data voltage DATA, and display quality of the display device may be deteriorated.

According to an embodiment of the invention, the display device 10 may include the first lower pattern LP1 disposed between the second organic film layer PI2 and the first active pattern 1100. The first lower pattern LP1 may shield the first active pattern 1100 from the polarized organic materials. Accordingly, the back channel may not be formed in the first active pattern 1100 and electrical characteristics of the first transistor T1 may not be changed. Accordingly, the display quality of the display device 10 may be improved.

In such an embodiment, as described above, the first lower pattern LP1 may have the mesh shape in which the unit patterns UP are repeatedly arranged. As the first lower pattern LP1 has the mesh shape, a surface area of the first lower pattern LP1 may increase, and the resistance of the first lower pattern LP1 may decrease. Accordingly, the first lower pattern LP1 may effectively suppress the polarization of the organic materials.

FIGS. 20 to 28 are cross-sectional views illustrating an embodiment of a method of manufacturing the display device of FIG. 1. Particularly, In FIGS. 20 to 28, a cross-sectional view taken along line II-II' of FIG. 18 may be shown.

Figure 20:
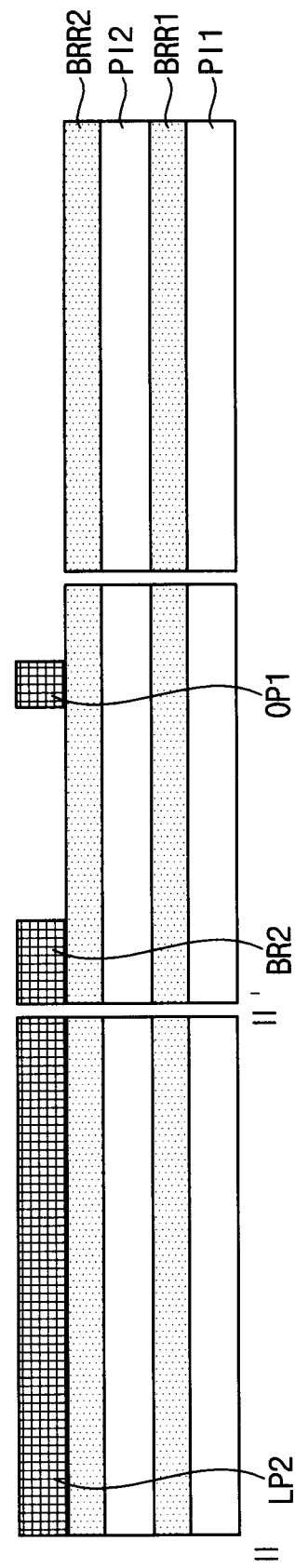
FIGS. 20 to 28 are cross-sectional views illustrating an embodiment of a method of manufacturing the display device of FIG. 1.

Referring to FIGS. 8, 18, and 20, in an embodiment of a method of manufacturing the display device, the first barrier layer BRR1 may be provided or formed on the first organic film layer PI1, the second organic film PI2 may be provided or formed on the first barrier layer BRR1, and the second barrier layer BRR2 may be provided or formed on the second organic film layer PI2. In such an embodiment, the first lower pattern LP1 and the second lower pattern LP2 may be provided or formed on the second barrier layer BRR2. In such an embodiment, as described above, the first lower pattern LP1 may include the first overlap pattern OP1 and the second bridges BR2.

The first overlap pattern OP1 and the second bridges BR2 may be disposed in the display area DA, and the second lower pattern LP2 may be disposed in the non-display area NDA. In such an embodiment, the second bridges BR2 and the second lower pattern LP2 may be connected to each other. In an embodiment, the first lower pattern LP1 and the second lower pattern LP2 may be formed together during a same process.

Figure 21:
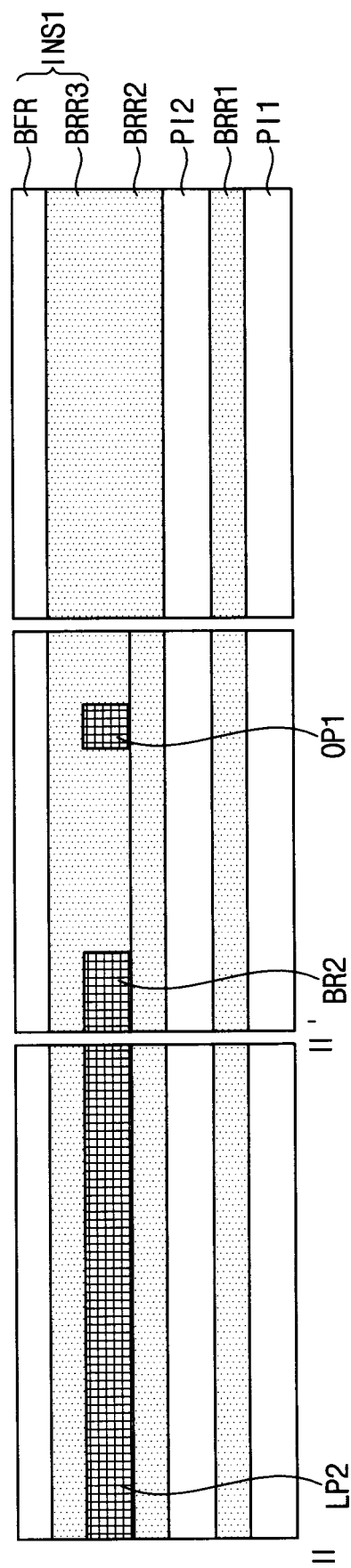

Referring to FIGS. 10, 18, and 21, a first insulating layer INS1 may be provided or formed on the first lower pattern LP1 and the second lower pattern LP2. In an embodiment, the first insulating layer INS1 may include the third barrier layer BRR3 and the buffer layer BFR. The first insulating layer INS1 may overlap the display area DA, the non-display area NDA, and the bending area BA.

Figure 22:
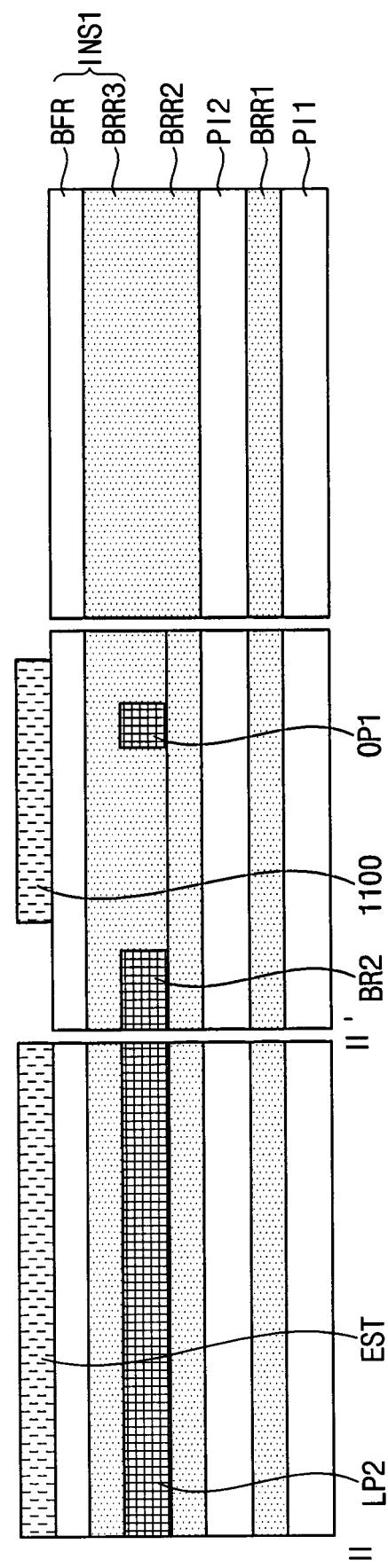

Referring to FIGS. 11, 18, and 22, the etch stopper EST and the first active pattern 1100 may be provided or formed on the first insulating layer INS1 together. The etch stopper EST may overlap the second lower pattern LP2 in the non-display area NDA. The first active pattern 1100 may overlap the first lower pattern LP1 in the display area DA.

Figure 23:
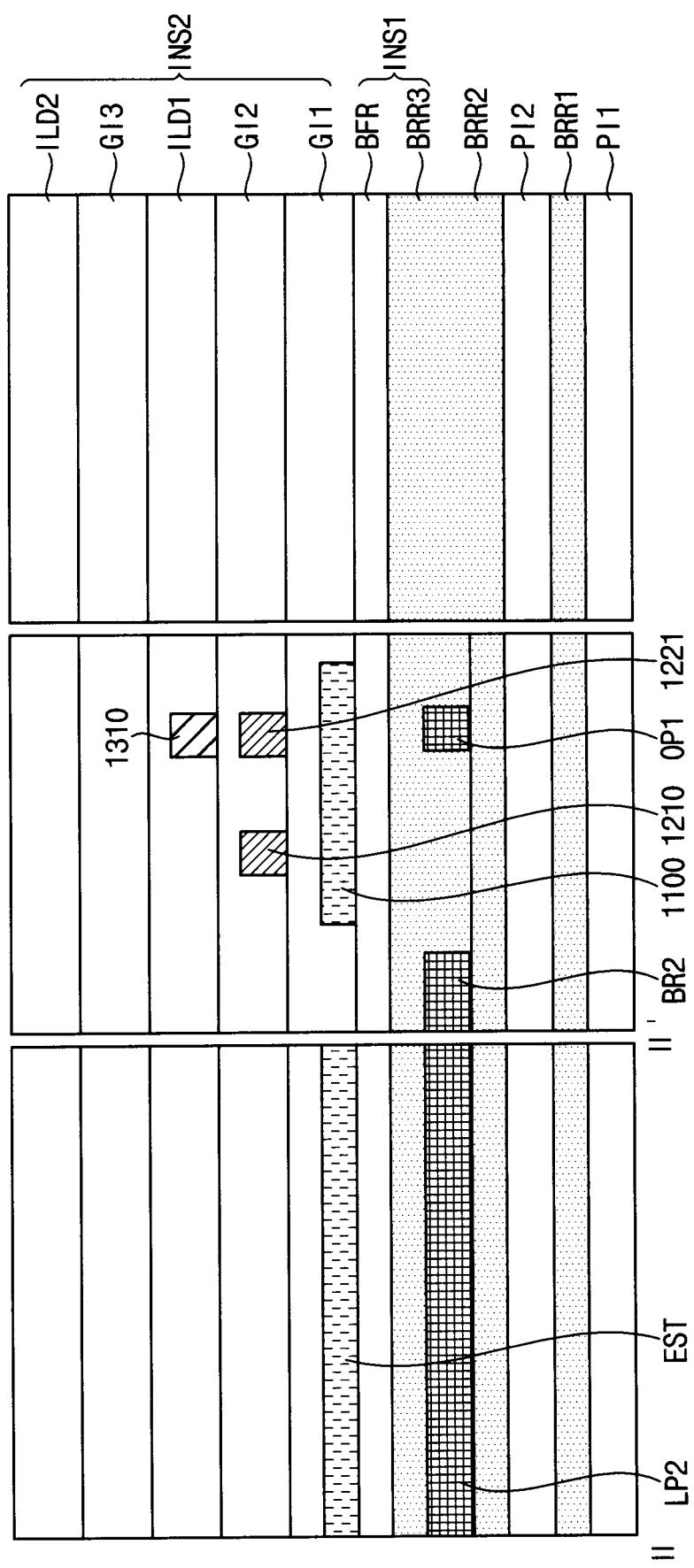

Referring to FIGS. 16, 18, and 23, a second insulating layer INS2 may be provided or formed on the etch stopper EST and the first active pattern 1100. The second insulating layer INS2 may include the first gate insulating layer GI1, the second gate insulating layer GI2, the first interlayer insulating layer ILD1, the third gate insulating layer GI3, and the second interlayer insulating layer ILD2.

In an embodiment, the first gate insulating layer GI1 may be provided or formed on the etch stopper EST and the first active pattern 1100. The first conductive pattern 1200 (e.g., the first gate line 1210 and the first gate electrode 1221) may be provided or formed on the first gate insulating layer GI1.

The second gate insulating layer GI2 may be provided or formed on the first conductive pattern 1200. The second conductive pattern 1300 (e.g., the storage capacitor electrode 1310) may be provided or formed on the second gate insulating layer GI2.

The first interlayer insulating layer ILD1 may be provided or formed on the second conductive pattern 1300. The second active pattern 1400 may be provided or formed on the first interlayer insulating layer ILD1.

The third gate insulating layer GI3 may be provided or formed on the second active pattern 1400. The third conductive pattern 1500 may be provided or formed on the third gate insulating layer GI3.

The second interlayer insulating layer ILD2 may be provided or formed on the third conductive pattern 1500. The second insulating layer INS2 may overlap the display area DA, the non-display area NDA, and the bending area BA.

Figure 24:
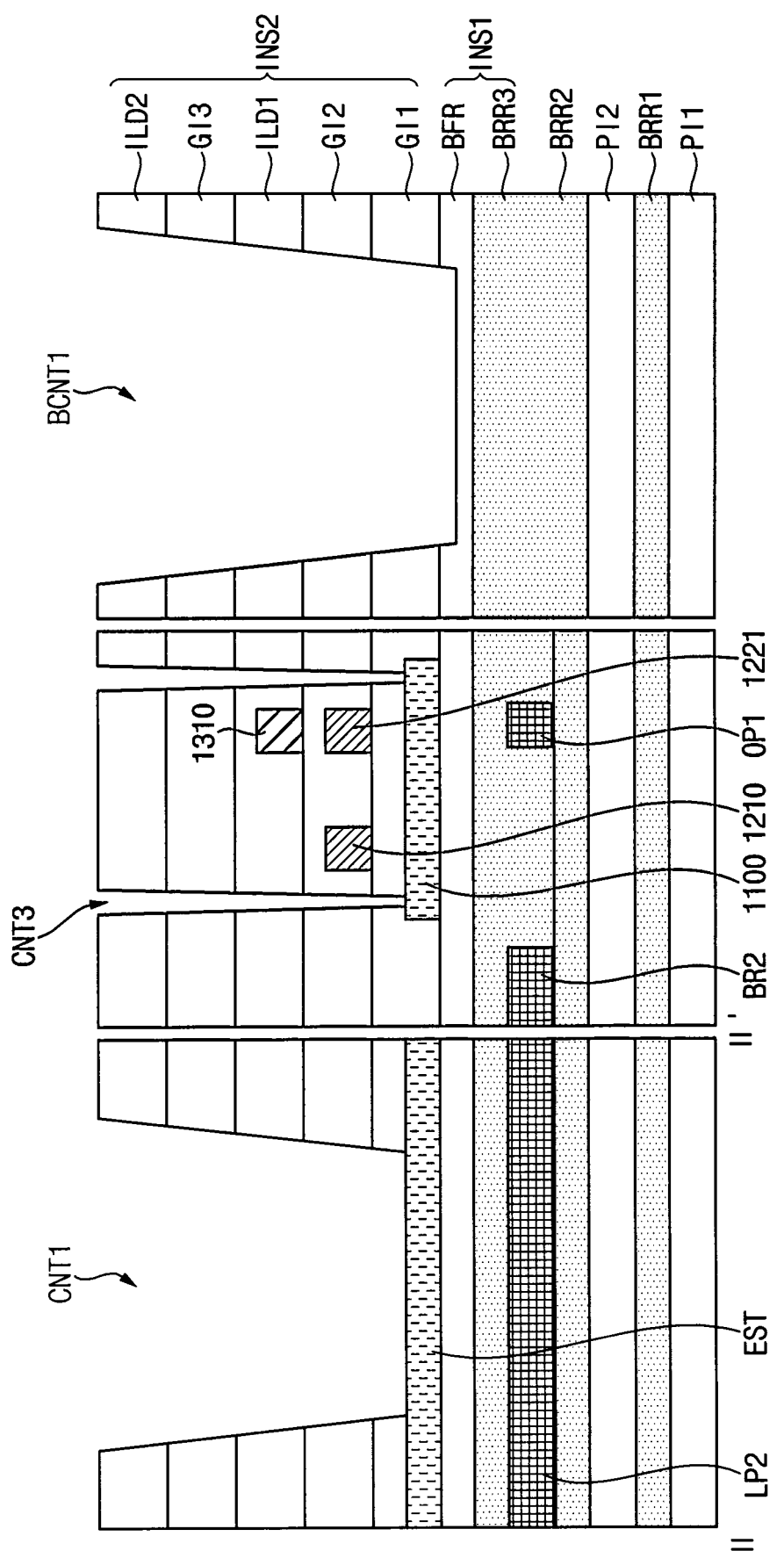

Referring to FIGS. 17, 18, and 24, the first contact hole CNT1, the third contact hole CNT3, and the first etching hole BCNT1 may be formed.

In an embodiment, the first contact hole CNT1 may be formed in the non-display area NDA. The first contact hole CNT1 may be formed through the second insulating layer INS2 and may expose the etch stopper EST.

In an embodiment, the third contact hole CNT3 may be formed in the display area DA. The third contact hole CNT3 may be formed through the second insulating layer INS2 and may expose the first active pattern 1100.

In an embodiment, the first etching hole BCNT1 may be formed in the bending area BA. The first etching hole BCNT1 may be formed through the second insulating layer INS2 and may expose the buffer layer BFR. In such an embodiment, when an etching rate of the etch stopper EST is less than an etching rate of the second insulating layer INS2, a depth of the first etching hole BCNT1 may be greater than a depth of the first contact hole CNT1 (or a depth of the third contact hole CNT3). In one embodiment, for example, the depth of the first etching hole BCNT1 may be greater than the depth of the first contact hole CNT1 by more than the thickness of the etch stopper EST.

Figure 25:
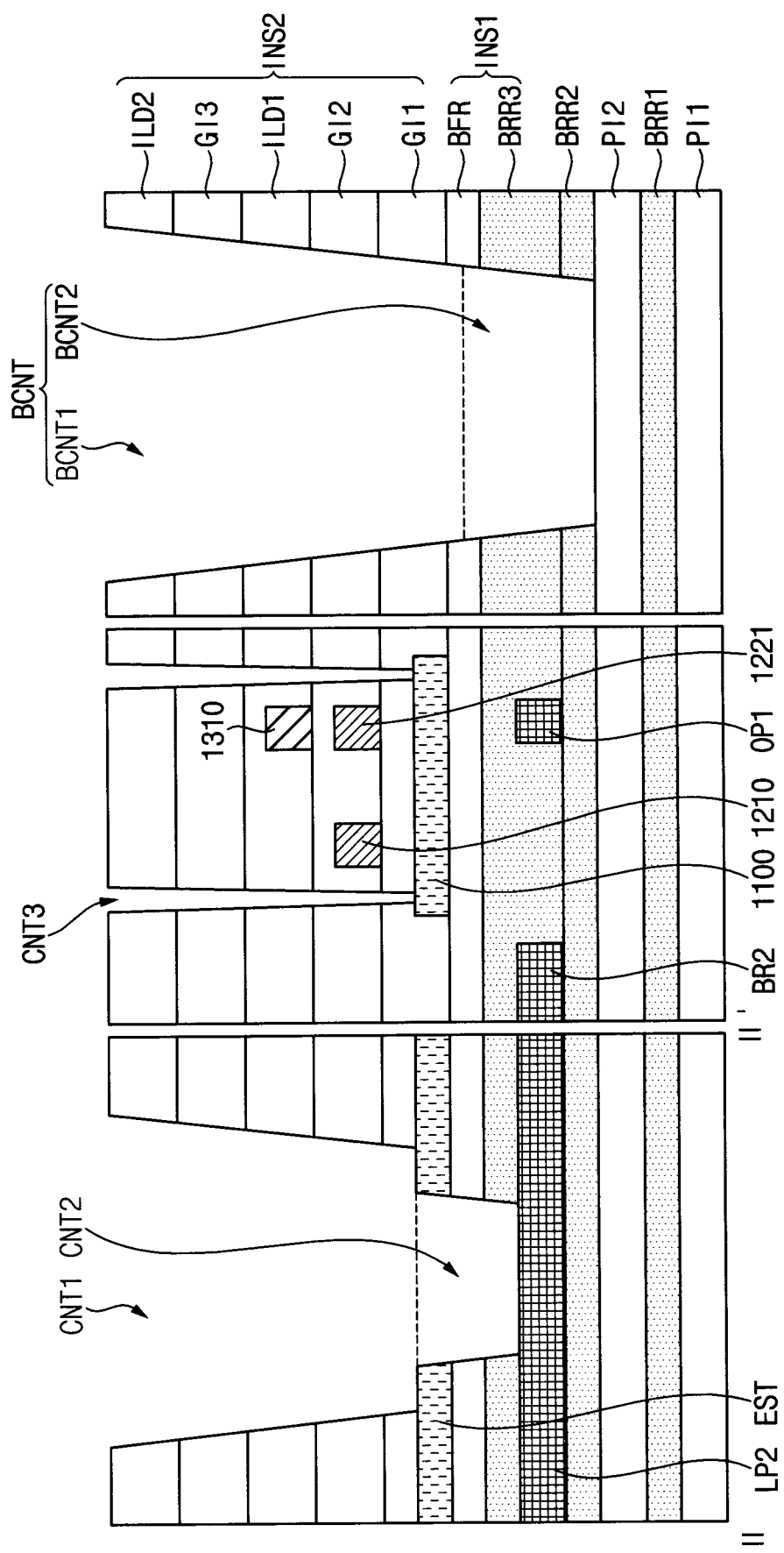

Referring to FIGS. 17, 18, and 25, the second contact hole CNT2 and the second etching hole BCNT2 may be formed.

In an embodiment, the second contact hole CNT2 may be formed in the non-display area NDA. In one embodiment, for example, the second contact hole CNT2 may be connected to the first contact hole CNT1. In addition, the second contact hole CNT2 may be formed through the etch stopper EST and the first insulating layer INS1, and may expose the second lower pattern LP2.

In an embodiment, the second etching hole BCNT2 may be formed together with the second contact hole CNT2. The second etching hole BCNT2 may be connected to the first etching hole BCNT1. In such an embodiment, as the etch rate of the etch stopper EST and the etch rate of the first insulating layer INS1 are different from each other, the depth of the second etch hole BCNT2 may be greater than the depth of the second contact hole CNT2. In one embodiment, for example, the second etching hole BCNT2 may be formed through the first insulating layer INS1 and may expose the second organic film layer PI2. The first etching hole BCNT1 and the second etching hole BCNT2 may be defined as an etching hole BCNT.

In an embodiment, the first contact hole CNT1 may be formed through a first etching process performed under a first etching condition, and the second contact hole CNT2 may be formed through a second etching process under a second etching condition. The first etching condition may be an etching condition having a high etch selectivity between the second insulating layer INS2 and the etch stopper EST, and the second etching condition may be an etching condition having a low etch selectivity between the first insulating layer INS1 and the etch stopper EST.

Referring to FIGS. 18, 24, and 25, a plurality of first contact holes CNT1 may be formed in the second insulating layer INS2, and a plurality of second contact holes CNT2 may be formed in the second insulating layer INS1. In one embodiment, for example, as the etch selectivity between the second insulating layer INS2 and the etch stopper EST is set to be high, the etch rate of the second insulating layer INS2 may be high and the etch rate of the etch stopper EST may be low. Accordingly, the etch stopper EST may reduce a dispersion of depths of the first contact holes CNT1. In such an embodiment, the etch uniformity of the first etching process may be improved. As the dispersion of the first contact holes CNT1 is reduced, the first insulating layer INS1 overlapping the non-display area NDA may not be etched while the first etching process is performed.

In such an embodiment, as the dispersion of the depths of the first contact holes CNT1 is reduced, a dispersion of the depths of the second contact holes CNT2 may also be reduced. In such an embodiment, etching uniformity of the second etching process may be improved. Accordingly, while the second etching process is performed, the second lower pattern LP2 may not be lost. Therefore, a process margin of the second lower pattern LP2 may be secured, and the thickness of the second lower pattern LP2 and the thickness of the first lower pattern LP1 formed together with the second lower pattern LP2 may be set to be small. Accordingly, productivity of the first and second lower patterns LP1 and LP2 may be increased.

In such an embodiment, as the thickness of the first lower pattern LP1 is set to be small, a difficulty of the crystallization process (e.g., excimer laser annealing ("ELA") process) of the first active pattern 1100, a difficulty of an inspection process performed before the crystallization process, and/or a difficulty of an inspection process performed after the crystallization process may be lowered.

Figure 26:
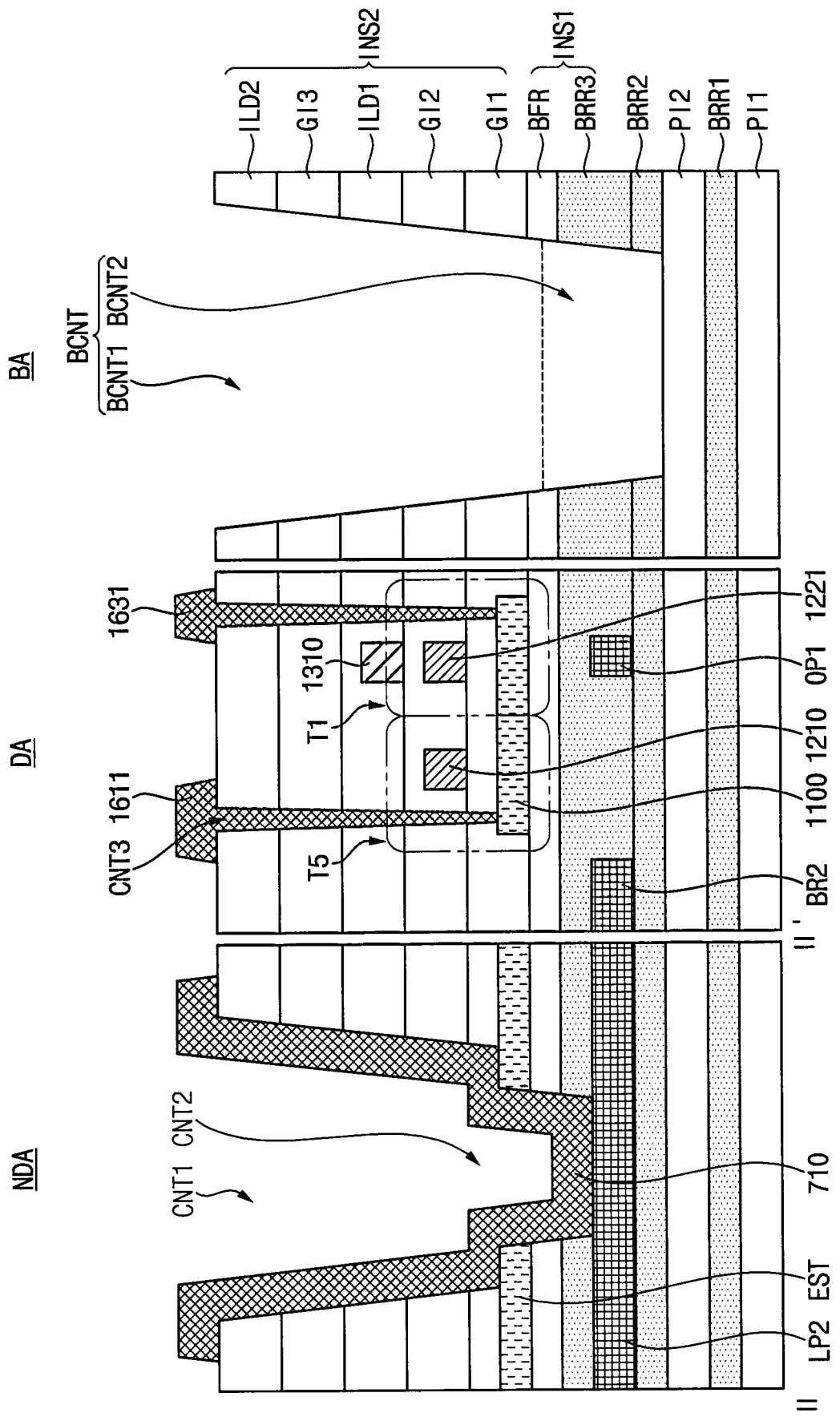

Referring to FIGS. 17, 18, and 26, the first pattern 710 and the fourth conductive pattern 1600 (e.g., the first power voltage connection pattern 1611 and the first compensation connection pattern 1631) may be provided or formed together.

In an embodiment, the first pattern 710 may be formed in the non-display area NDA. The first pattern 710 may contact the etch stopper EST and the second lower pattern LP2 through the first and second contact holes CNT1 and CNT2.

In an embodiment, the first power voltage connection pattern 1611 and the first compensation connection pattern 1631 may be formed in the display area DA. In one embodiment, for example, the first power voltage connection pattern 1611 may directly contact the first active pattern 1100 through the third contact hole CNT3. In such an embodiment, the first compensation connection pattern 1631 may directly contact the first active pattern 1100 through a contact hole.

Figure 27:
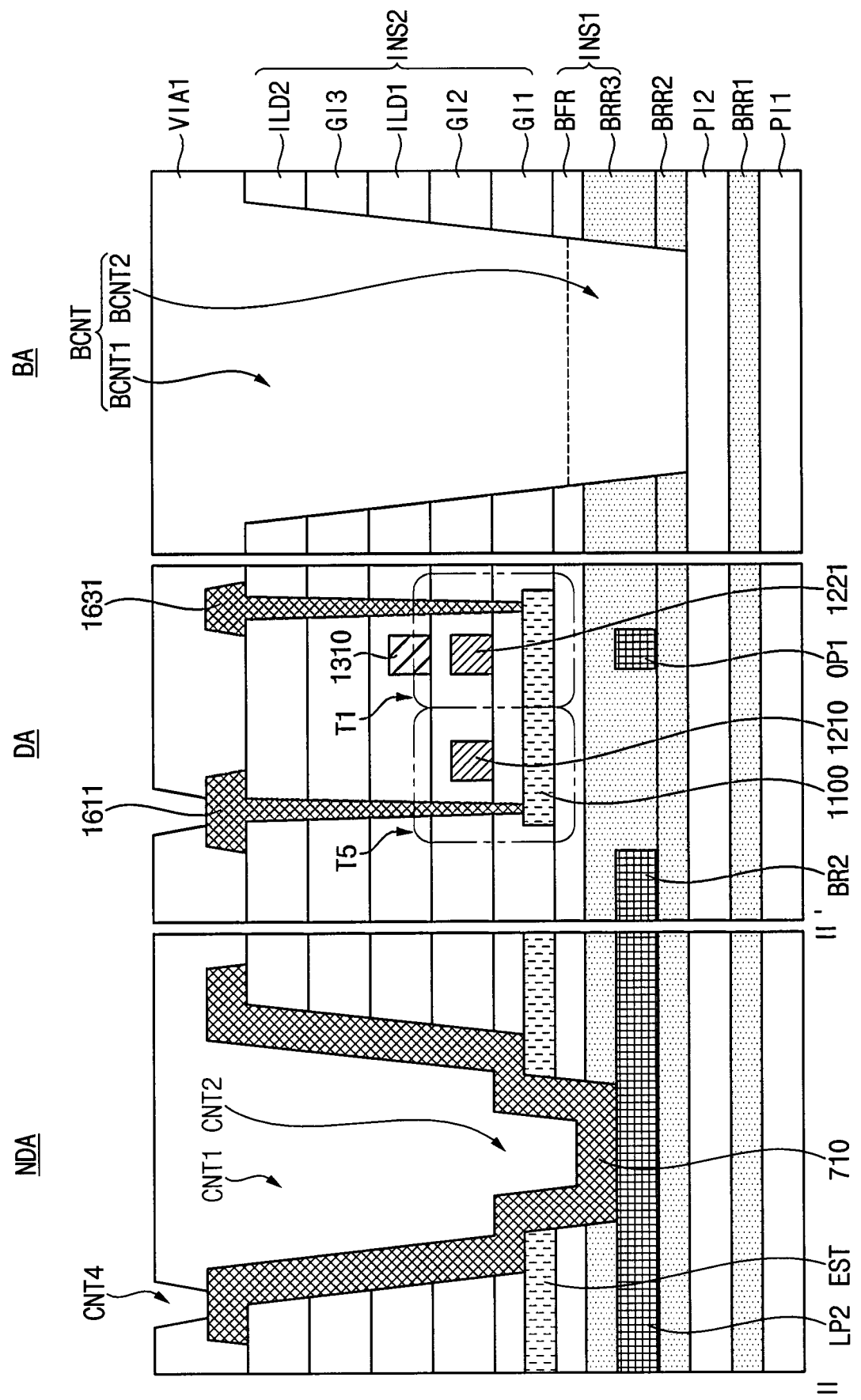

Referring to FIGS. 18 and 27, the first via insulating layer VIA1 may be provided or formed on the first pattern 710 and the fourth conductive pattern 1600. The first via insulating layer VIA1 may fill an inside of the first contact hole CNT1, an inside of the second contact hole CNT2, and an inside of the etching hole BCNT. In such an embodiment, contact holes may be formed through the first via insulating layer VIA1. In one embodiment, for example, the fourth contact hole CNT4 may be formed to expose the first pattern 710. In such an embodiment, a contact hole exposing the first power voltage connection pattern 1611 may be formed together with the fourth contact hole CNT4.

Figure 28:
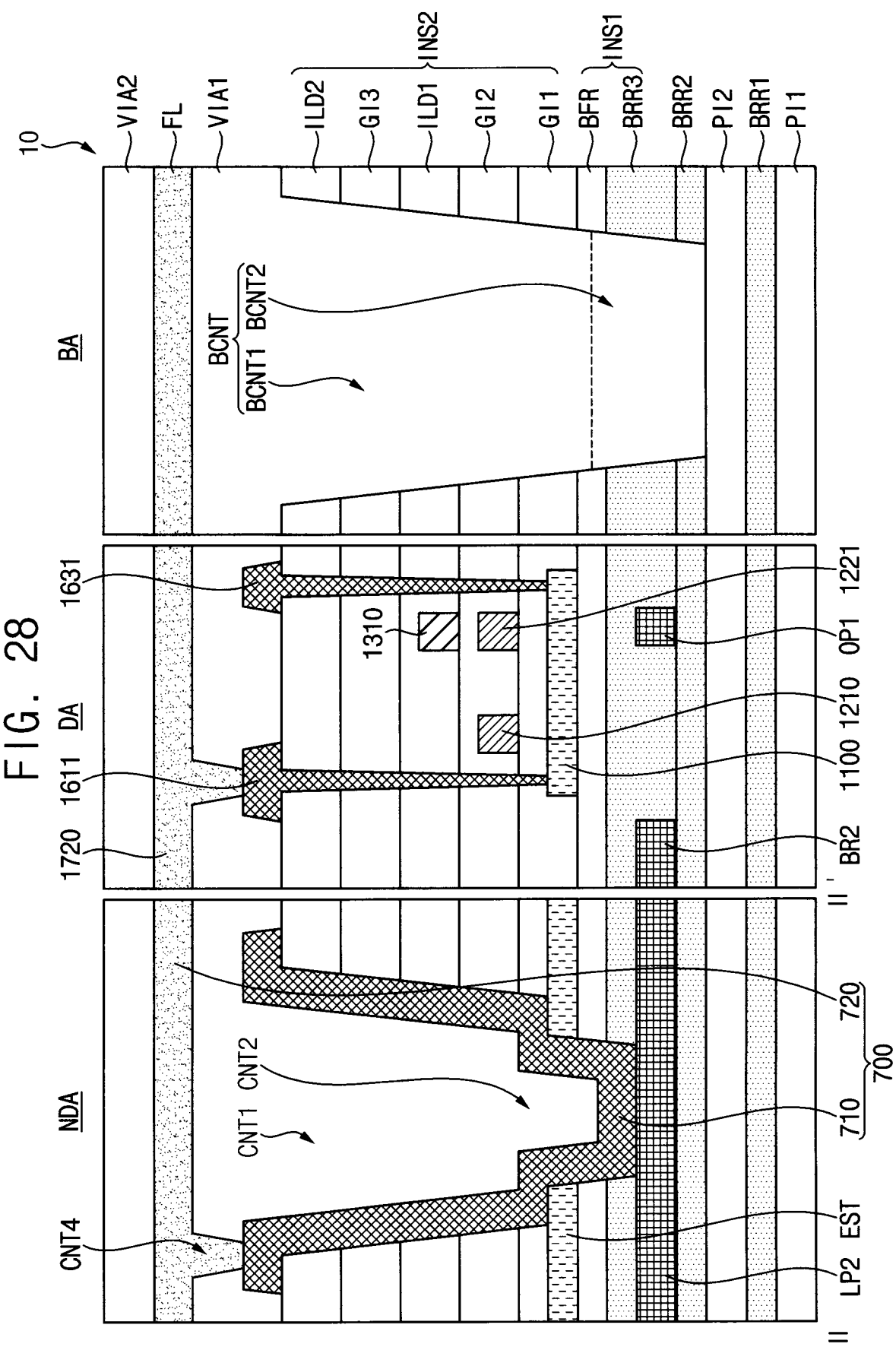

Referring to FIGS. 18 and 28, the second pattern 720, the fifth conductive pattern 1700 (e.g., the power voltage line 1720), and the fan-out line FL may be provided or formed together on the first via insulating layer VIA1. The second via insulating layer VIA2 may be provided or formed on the second pattern 720, the fifth conductive pattern 1700, and the fan-out line FL.

In an embodiment, the second pattern 720 may be formed in the non-display area NDA. The second pattern 720 may directly contact the first pattern 710 through the fourth contact hole CNT4. In an embodiment, the second pattern 720 may be integrally formed with the power voltage line 1720 as a single unitary unit.

In an embodiment, the power voltage line 1720 may be formed in the display area DA. The power voltage line 1720 may directly contact the first power voltage connection pattern 1611 through the contact hole formed in the first via insulating layer VIA1.

In an embodiment, the fan-out line FL may be formed in the bending area BA. In such an embodiment, as described above, the fan-out line FL may transfer the power voltage ELVDD.

In embodiments of the invention, as described above, the display device 10 may include the first lower pattern LP1 disposed between the second organic film layer PI2 and the first active pattern 1100.

The first lower pattern LP1 may include overlap patterns OP overlapping the gate electrodes (e.g., the first gate electrode 1221 and the second gate electrode 1222). The overlap patterns OP may shield the first active pattern 1100 from polarization of organic materials included in the second organic film layer PI2. Accordingly, the electrical characteristics of the first transistor T1 may not be changed.

In such embodiments, the first lower pattern LP1 may have the mesh shape in which the unit patterns UP are repeatedly arranged. As the first lower pattern LP1 has the mesh shape, the surface area of the first lower pattern LP1 may increase, and the resistance of the first lower pattern LP1 may decrease. Accordingly, the first lower pattern LP1 may effectively suppress the polarization of the organic materials.

In such embodiments, the display device 10 may include the transfer pattern 700 connected to the power voltage line 1720. As the transfer pattern 700 retransmits the power voltage ELVDD from the upper side of the display panel 100, the voltage drop of the power voltage ELVDD provided to the power voltage line 1720 may be effectively prevented.

In such embodiments, the transfer pattern 700 may contact the second lower pattern LP2, and the second lower pattern LP2 may be connected to the first lower pattern LP1. As the second lower pattern LP2 retransmits the power voltage ELVDD from the upper side of the display panel 100, the voltage drop of the power voltage ELVDD provided to the first lower pattern LP1 may be effectively prevented.

In such embodiments, the transfer pattern 700 may contact the second lower pattern LP2 through the first and second contact holes CNT1 and CNT2, and the first and second contact holes CNT1 and CNT2 may be formed together with the third contact hole CNT3 and the etching hole BCNT. Accordingly, the first and second contact holes CNT1 and CNT2 may be formed without any additional process.

In such embodiments, the etch stopper EST may be disposed on the second lower pattern LP2. In one embodiment, for example, the etch stopper EST may have a high etch selectivity compared to the second insulating layer INS2 and may have a low etch selectivity compared to the first insulating layer INS1. As the etch stopper EST reduces the dispersion of the depths of the first contact holes CNT1 and the depths of the second contact holes CNT2, the etch uniformity of the first etching process and the etch uniformity of the second etching process may be improved. Accordingly, while the second etching process is performed, the second lower pattern LP2 may not be lost, and the thicknesses of the first and second lower patterns LP1 and LP2 may be set to be relatively small. Accordingly, productivity of the first and second lower patterns LP1 and LP2 may be increased. In such an embodiment, as the thickness of the first lower pattern LP1 is set to be small, the difficulty of the crystallization process of the first active pattern 1100, the difficulty of the inspection process performed before performing the crystallization process, and/or the difficulty of an inspection process performed after performing the crystallization process may be lowered.

Figure 29:
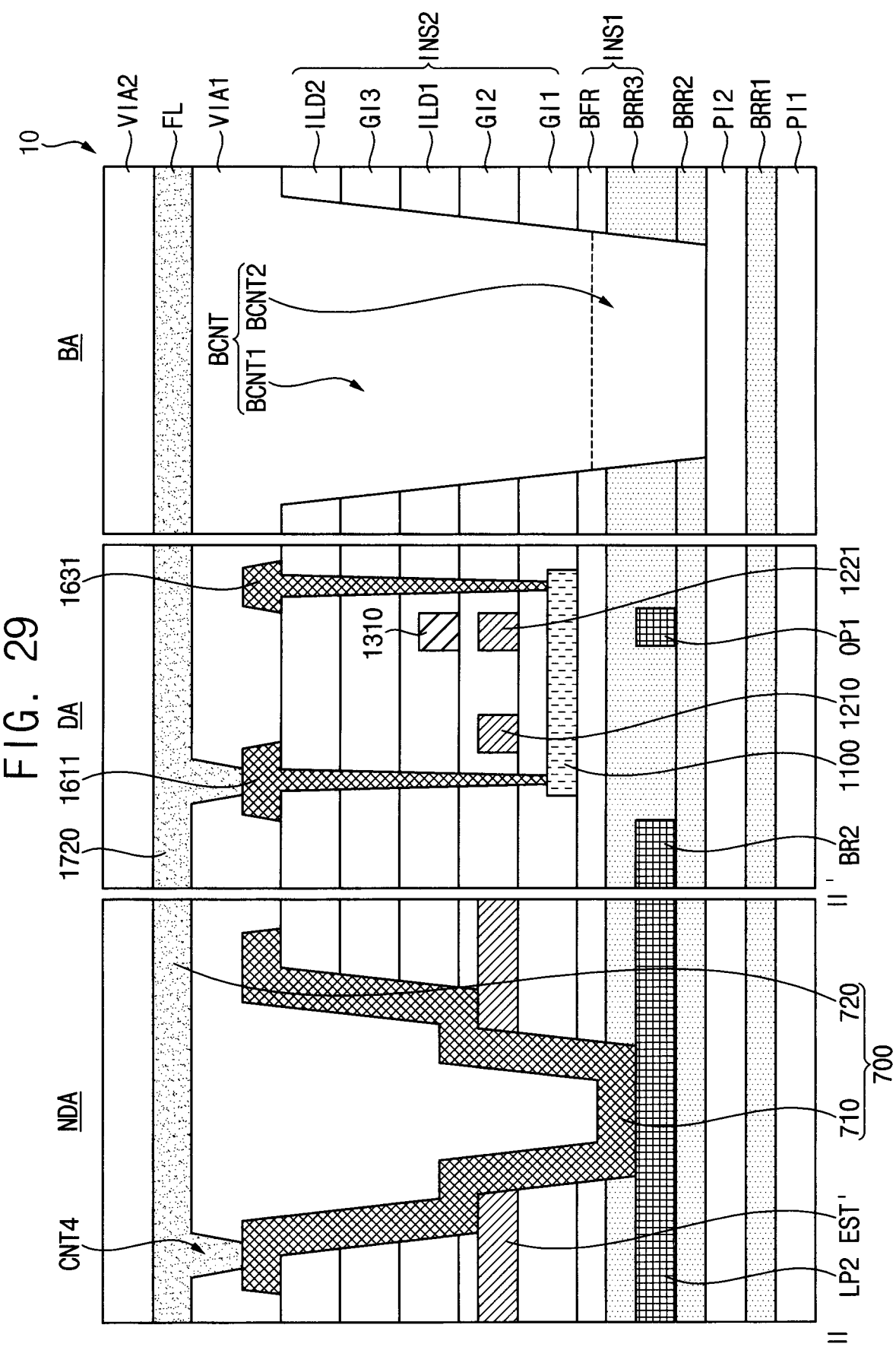
FIG. 29 is a cross-sectional view illustrating a display device according to an alternative embodiment.

FIG. 29 is a cross-sectional view illustrating a display device according to an alternative embodiment.

Referring to FIG. 29, an etch stopper EST' may be provided or formed together with the first conductive pattern 1200 (e.g., the first gate line 1210, the first gate electrode 1221, etc.). Accordingly, the etch stopper EST' may include a same material as the first conductive pattern 1200 and may be disposed in a same layer as the first conductive pattern 1200.

In embodiments of the invention, the position where the etch stopper EST' is formed is not limited thereto. In an alternative embodiment, the etch stopper EST' may be formed between the second lower pattern LP2 and the first pattern 710. In one embodiment, for example, the etch stopper EST' may be formed together with the second conductive pattern 1300, the second active pattern 1400, or the third conductive pattern 1500. In such embodiments, the number of the etch stoppers EST' is not limited thereto. In one embodiment, for example, the etch stopper EST' may include a plurality of vertically stacked etch stoppers.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate including a display area and a non-display area surrounding the display area;
   a first lower pattern disposed on the substrate and overlapping the display area;

a second lower pattern disposed in a same layer as the first lower pattern, overlapping the non-display area, and integrally formed with the first lower pattern;

an etch stopper disposed on the second lower pattern;

a power voltage line disposed on the first lower pattern;

a transfer pattern disposed on the etch stopper, connected to the power voltage line, and contacting the second lower pattern through a contact hole defined through the etch stopper; and a gate electrode disposed on the first lower pattern and disconnected from the first lower pattern, wherein the power voltage line provides a power voltage, which is a constant voltage, to the transfer pattern, and the power voltage is provided to the first lower pattern through the transfer pattern and the second lower pattern.

2. The display device of claim 1, further comprising:

a first active pattern disposed on the first lower pattern and overlapping the first lower pattern, wherein the etch stopper is disposed in a same layer as the first active pattern.

3. The display device of claim 1, wherein the etch stopper includes a silicon semiconductor.

4. The display device of claim 1, wherein the etch stopper includes an oxide semiconductor.

5. The display device of claim 1, wherein the transfer pattern comprises:

a first pattern contacting the second lower pattern; and a second pattern disposed on the first pattern, contacting the first pattern, and integrally formed with the power voltage line.

6. The display device of claim 1, wherein the first lower pattern comprises:

an overlap pattern overlapping a gate electrode;

first bridges connected to the overlap pattern and extending along a first direction; and second bridges connected to the overlap pattern, extending along a second direction crossing the first direction, and overlapping the power voltage line, and wherein the second lower pattern extends along the first direction and is connected to the second bridges.

7. The display device of claim 1, further comprising:

a first active pattern disposed on the first lower pattern and overlapping the first lower pattern; and a gate electrode disposed on the first active pattern and overlapping the first lower pattern, wherein the etch stopper is disposed in a same layer as the gate electrode.

8. The display device of claim 1, further comprising:

a first barrier layer disposed between the substrate and the second lower pattern; and a second barrier layer disposed on the second lower pattern.

9. The display device of claim 1, wherein the substrate further includes a bending area included in the non-display area, wherein an etching hole is defined through an insulating layer overlapping the bending area, and wherein a depth of the etching hole is greater than a depth of the contact hole.

10. The display device of claim 1, wherein the contact hole includes a first contact hole and a second contact hole connected to the first contact hole, and wherein a plane area of the second contact hole is smaller than a plane area of the first contact hole.

* * * * *